United States Patent
Isobe et al.

(10) Patent No.: US 9,708,708 B2
(45) Date of Patent: Jul. 18, 2017

(54) METHOD OF MANUFACTURING SEMICONDUCTOR DEVICE

(71) Applicant: Hitachi Kokusai Electric Inc., Tokyo (JP)

(72) Inventors: Noriyuki Isobe, Toyama (JP); Yuji Takebayashi, Toyama (JP); Kenichi Suzaki, Toyama (JP); Takeshi Kasai, Toyama (JP); Atsushi Hirano, Toyama (JP); Koichi Oikawa, Toyama (JP)

(73) Assignee: Hitachi Kokusai Electric, Inc., Tokyo (JP)

( * ) Notice: Subject to any disclaimer, the term of this patent is extended or adjusted under 35 U.S.C. 154(b) by 0 days.

(21) Appl. No.: 15/260,037

(22) Filed: Sep. 8, 2016

(65) Prior Publication Data

US 2017/0067159 A1  Mar. 9, 2017

(30) Foreign Application Priority Data

Sep. 9, 2015  (JP) ................................ 2015-177841

(51) Int. Cl.
*C23C 16/455* (2006.01)
*C23C 16/40* (2006.01)

(52) U.S. Cl.
CPC ...... *C23C 16/403* (2013.01); *C23C 16/45525* (2013.01); *C23C 16/45578* (2013.01)

(58) Field of Classification Search
CPC ........ C23C 16/45514; C23C 16/45578; H01L 21/02271; H01L 21/0228
See application file for complete search history.

(56) References Cited

U.S. PATENT DOCUMENTS

2008/0166886 A1   7/2008  Sakai et al.
2009/0017638 A1*  1/2009  Yoshino ................ C23C 16/345
                                                    438/758

FOREIGN PATENT DOCUMENTS

| JP | 1998012559 | 1/1998 |
| JP | 2000297375 | 10/2000 |
| JP | 2008078448 | 4/2008 |
| JP | 2014127702 | 7/2014 |

* cited by examiner

*Primary Examiner* — Daniel Shook
(74) *Attorney, Agent, or Firm* — Edell, Shapiro & Finnan LLC

(57) ABSTRACT

A film is efficiently formed by sufficiently supplying a source gas to substrates accommodated in a process chamber, and the uniformity of a film formed on the substrates is improved. A method of a semiconductor device manufacturing includes (a) supplying a source gas to an upper region of a process chamber through a first gas supply hole disposed at a front end of a first nozzle disposed in a lower region of the process chamber where the source gas is not pyrolyzed; (b) supplying the source gas to substrates disposed in the lower region and a middle region of the process chamber through a plurality of second gas supply holes of a second nozzle; and (c) supplying a reactive gas to substrates disposed in the lower region, the middle region and the upper region of the process chamber through a plurality of third gas supply holes of a third nozzle.

14 Claims, 18 Drawing Sheets

202

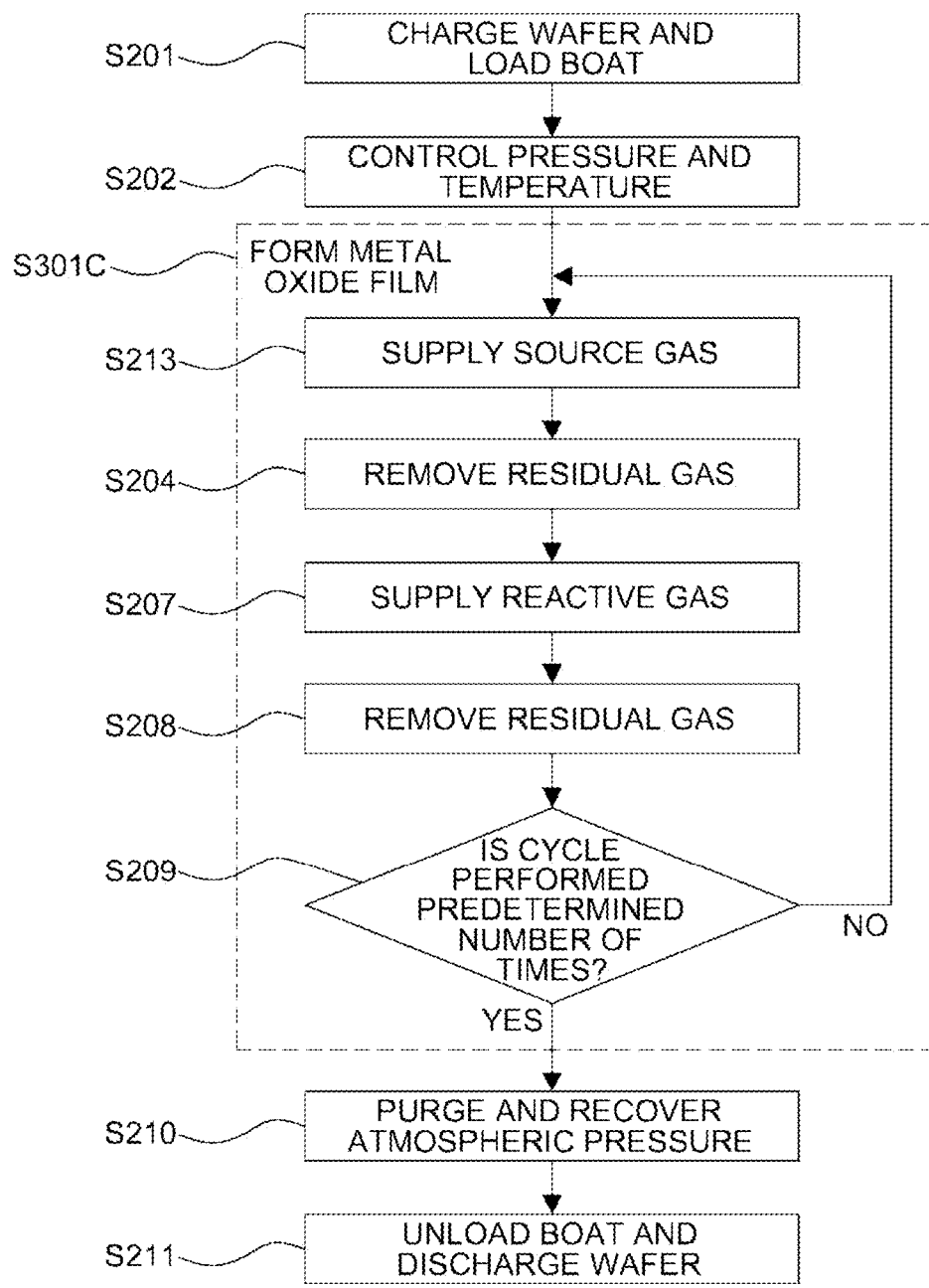

METHOD OF MANUFACTURING SEMICONDUCTOR DEVICE

CROSS REFERENCE TO RELATED APPLICATIONS

This application claims foreign priority under 35 U.S.C. §119(a)-(d) to Japanese Patent Application No. 2015-177841, filed on Sep. 9, 2015, the entire contents of which are hereby incorporated by reference.

FIELD OF THE INVENTION

The present disclosure relates to a method of manufacturing a semiconductor device.

BACKGROUND

Conventionally, a substrate processing apparatus for manufacturing a semiconductor device by forming a thin film on a substrate such as a silicon wafer, and a method of manufacturing a semiconductor device have been developed.

For example, a method of manufacturing a semiconductor device, in which a film is formed on a substrate accommodated in a process chamber by sequentially supplying an evaporation gas and a reactive gas reacting with the evaporation gas into the process chamber accommodating the substrate therein has been known (see, Japanese Unexamined Patent Application Publication No. 2014-127702).

As described in Japanese Patent Application Publication No. 2014-127702, when a film is formed on a substrate accommodated in a process chamber by sequentially supplying a source gas and a reactive gas reacting with the source gas into the process chamber, it is required to efficiently form the film by sufficiently supplying the source gas to the substrate and enhance the uniformity of the film to be formed on the substrate.

SUMMARY

It is an object of the present invention to provide a technique of efficiently forming a film by sufficiently supplying a source gas to a substrate accommodated in a process chamber and enhancing the uniformity of a film to be formed on the substrate.

Means to solve the above problem will be described below. According to one aspect of the present invention, there is provided a technique including a method of a semiconductor device manufacturing including (a) supplying a source gas to an upper region of a process chamber where vertically stacked substrates are accommodated through a first gas supply hole disposed at a front end of a first nozzle disposed in a lower region of the process chamber where the source gas is not pyrolyzed, wherein the first nozzle is installed along a stacking direction of the vertically stacked substrates; (b) supplying the source gas to substrates disposed in the lower region and a middle region of the process chamber through a plurality of second gas supply holes of a second nozzle extending from the lower region to the middle region along the stacking direction, wherein the plurality of second gas supply holes are disposed at positions facing the substrates disposed in the lower region and the middle region; and (c) supplying a reactive gas to substrates disposed in the lower region, the middle region and the upper region of the process chamber through a plurality of third gas supply holes of a third nozzle extending from the lower region to the upper region along the stacking direction, wherein the plurality of third gas supply holes are disposed at positions facing the substrates of the vertically stacked substrates disposed in the lower region, the middle region and the upper region.

BRIEF DESCRIPTION OF THE DRAWINGS

FIGS. 10A through 10I are flowcharts of methods of manufacturing a semiconductor device according to embodiments of the present invention.

DETAILED DESCRIPTION

Figure 1:
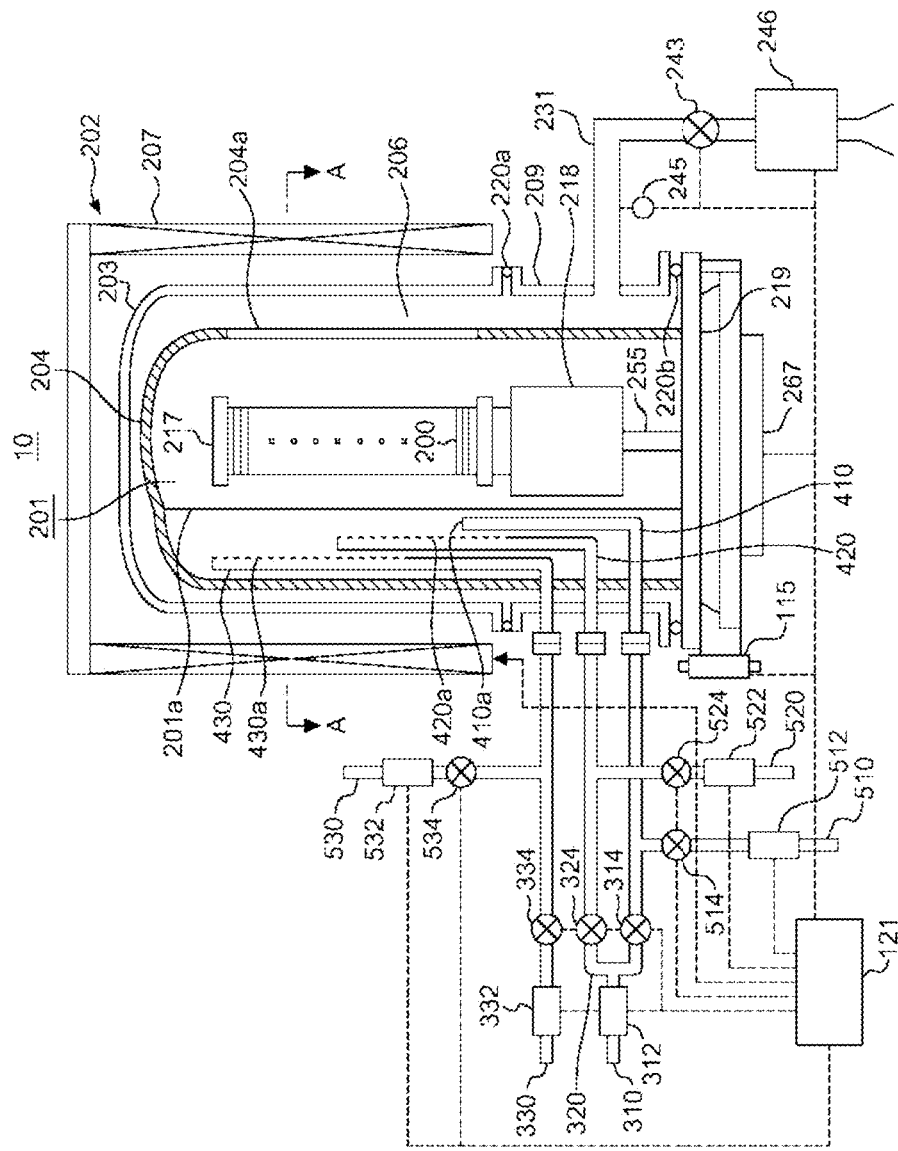
FIG. 1 is a diagram schematically illustrating a longitudinal section of a vertical process furnace of a substrate processing apparatus according to a first embodiment.

A film is formed on substrates accommodated in a process chamber by sequentially supplying a source gas and a reactive gas reacting with the source gas into the process chamber. When the source gas is supplied into the process chamber heated to a decomposition temperature of the source gas or more, the source gas is decomposed when passing through a region of the process chamber heated to the decomposition temperature or more. Thus, the source gas may be consumed before it arrives at the substrates. For example, when the source gas is supplied into a process chamber of a longitudinal device accommodating a plurality of substrates stacked on a substrate support member, the source gas is emitted horizontally to the plurality of substrates via a plurality of gas supply holes of a nozzle extending from a lower region of the process chamber to an upper region thereof (a long nozzle) in a direction in which the plurality of substrates are stacked. However, when the source gas passes through a region of the nozzle heated to the decomposition temperature or more, the source gas may be decomposed and attached to the inside of the nozzle (that is, the source gas may be consumed in the nozzle). When the source gas is consumed in the nozzle, the source gas is not sufficiently supplied onto a substrate provided at a front end of the nozzle (an upper (top) region of the process chamber, an upper (top) region of the substrate support member). Thus, the uniformity of thickness of the film formed on the substrates provided in different regions may be low.

The inventors of the present application conducted research and found that the uniformity of a film was improved when the shape of a nozzle and process conditions with respect to a target region including an upper region and a lower region of a process chamber are optimum. When a source gas flows in the long nozzle, it tends that a channel is long and pressure applied thereto is high and thus the source gas is easily pyrolyzed. To improve this problem, for example, a short nozzle and a middle nozzle are installed in the process chamber. The short nozzle is a nozzle configured to supply the source gas and extends in a region of the process chamber other than a uniform temperature region thereof. Gas supply holes of the short nozzle are open at a front end of the nozzle provided in the region of the process chamber other than the uniform temperature region. The middle nozzle is a nozzle provided in the uniform temperature region of the process chamber and extends up to a middle (middle region) of a region in which the substrates are stacked. The middle nozzle includes a plurality of gas supply holes. The plurality of gas supply holes are open toward surfaces of the substrates from the lower region of the process chamber to the vicinity of the middle of the process chamber in the direction in which the substrates are stacked, so that the source gas may be emitted to the surfaces of the substrates in a horizontal direction. For example, the source gas is supplied to the middle region and the upper region of the process chamber by controlling a flow rate of the source gas supplied via the short nozzle, the sum of flow rates of the source gas and an inert gas when the inert gas is supplied via the short nozzle together with the supply of the source gas, hereinafter referred to simply as the flow rate of the source gas, when the inert gas is supplied via the short nozzle via which the source gas is supplied together with the supply of the source gas, one or both of the source gas and the inert gas may be controlled in a flow rate. This also applies hereinafter. When the source gas is supplied via the middle nozzle, the source gas is emitted horizontally to the surfaces of the substrates and is thus supplied to the lower region and the middle region of the process chamber in which the plurality of gas supply holes are open. That is, the source gas supplied via the short nozzle is supplied to a region distant from the plurality of gas supply holes which are open in the middle nozzle (or a front end of the middle nozzle), i.e., the upper region. Since the source gas may be uniformly and sufficiently supplied to the lower region, the middle region and the upper region of the process chamber, the source gas may also be uniformly and sufficiently supplied to a lower region, a middle region and an upper region of the substrate support member. Accordingly, the uniformity of a film formed on the plurality of substrates supported on the substrate support member may be improved.

In order to improve the uniformity of the film, for example, only one gas supply hole may be formed at a front end of the middle nozzle, similar to the short nozzle (that is, the gas supply hole is not formed at a position corresponding to the direction in which the substrates are stacked). The source gas is supplied to the lower region and the middle region of the process chamber by controlling the flow rate of the source gas using the short nozzle, and is supplied to the middle region and the upper region of the process chamber by controlling the flow rate of the source gas using the middle nozzle. In this case, the source gas may be supplied to the middle region and the upper region of the process chamber via the middle nozzle by adjusting, for example, the flow rate of the source gas to be supplied via the middle nozzle to be higher than that of the source gas to be supplied via the short nozzle. Furthermore, since the middle nozzle extends in the uniform temperature region, the source gas is likely to be pyrolyzed and thus a time duration of supplying the source gas via the middle nozzle may be shorter than that of supplying the source gas via the short nozzle.

In order to improve the uniformity of a film, only the short nozzle may be installed without the middle nozzle. The flow rate of the source gas is controlled to be high when the source gas is supplied to the middle region and the upper region of the process chamber, and is controlled to be low when the source gas is supplied to the lower region and the middle region of the process chamber, as will be described in detail below.

Hereinafter, "from A to B" refers to a range where A and B are a lower limit and an upper limit thereof, respectively. For example, "from 10 sccm to 500 sccm" refers to a range equal to or higher than 10 sccm and equal to or lower than 500 sccm.

First Embodiment

A first embodiment according to the present invention will be described with reference to FIGS. 1 through 3 below. A substrate processing apparatus 10 is an example of a device for use in a semiconductor device manufacturing process.

(Process Furnace)

The substrate processing apparatus 10 includes a process furnace 202 in which a heater 207 serving as a heating means (a heating mechanism, a heating system) is installed. The heater 207 has a cylindrical shape and is vertically installed by being supported by a heater base (not shown) which is a retaining plate.

At an inner side of the heater 207, an outer tube 203 constituting a reaction container (a process container) is formed concentrically with the heater 207. The outer tube 203 is formed of, for example, a heat-resistant material such as quartz ($SiO_2$) and silicon carbide (SiC), and has a cylindrical shape, the upper end of which is closed and the lower end of which is open. Below the outer tube 203, a manifold 209 (inlet flange) is installed concentrically with the outer tube 203. The manifold 209 is formed of, for example, a metal such as steel use stainless (SUS) and has a cylindrical shape, the upper and lower ends of which are open. An O-ring 220a which is a seal member is installed between the upper end of the manifold 209 and the outer tube 203. The outer tube 203 is installed vertically by supporting the manifold 209 by the heater base.

An inner tube 204 constituting the reaction container is installed at an inner side of the outer tube 203. The inner tube 204 is formed of, for example, a heat-resistant material such as quartz ($SiO_2$) and silicon carbide (SiC), and has a cylindrical shape, the upper end of which is closed and the lower end of which is open. The process container (reaction container) includes the outer tube 203, the inner tube 204 and the manifold 209. A process chamber 201 is formed in a hollow tubular portion of the process container (the inside of the inner tube 204).

The process chamber 201 may accommodate wafers 200 serving as substrates in a state in which the wafers 200 are vertically arranged in a horizontal posture in a multistage manner by a boat 217 to be described below.

Nozzles 410, 420 and 430 are installed in the process chamber 201 to penetrate sidewalls of the manifold 209 and the inner tube 204. Gas supply pipes 310, 320 and 330 which are gas supply lines are respectively connected to the nozzles 410, 420 and 430. As described above, a plurality of types of gases may be supplied into the process chamber 201 via the three nozzles 410, 420 and 430 and the three gas supply pipes 310, 320 and 330 of the substrate processing apparatus 10. However, the process furnace 202 according to the present embodiment is not limited thereto.

Mass flow controllers (MFCs) 312 and 332 which are flow rate controllers are respectively and sequentially installed at the gas supply pipes 310 and 330 from upstream ends of the gas supply pipes 310 and 330 to downstream ends thereof. The gas supply pipe 320 which branches off from the gas supply pipe 310 is installed at a downstream end of the MFC 312. Valves 314 and 324 which are opening/closing valves are respectively installed at the gas supply pipes 310 and 320. A valve 334 which is an opening/closing valve is installed at the gas supply pipe 330.

Gas supply pipes 510, 520 and 530 configured to supply an inert gas are respectively connected to downstream ends of the valves 314, 324 and 334 of the gas supply pipes 310, 320 and 330. MFCs 512, 522 and 532 which are flow rate controllers (flow rate control units) and valves 514, 524 and 534 which are opening/closing valves are sequentially installed at the gas supply pipes 510, 520 and 530 from upstream ends of the gas supply pipes 510, 520 and 530 to downstream ends thereof.

The nozzles 410, 420 and 430 are respectively connected to front ends of the gas supply pipes 310, 320 and 330. The nozzles 410, 420 and 430 include L-shaped nozzles, and horizontal portions thereof penetrate the sidewalls of the manifold 209 and the inner tube 204. Vertical portions of the nozzles 410, 420 and 430 protrude from the inner tube 204 and are installed in a spare chamber 201a having a channel shape (a groove shape) extending in the vertical direction. That is, the vertical portions of the nozzles 410, 420 and 430 are installed in the spare chamber 201a toward the top of the inner tube 204 (in the direction in which the wafers 200 are stacked) and along inner walls of the inner tube 204.

(First Nozzle)

The first nozzle 410 is installed in the lower region of the process chamber 201, and a gas supply hole (first gas supply hole) 410a is installed in a front end (a peak) of the first nozzle 410. Furthermore, the gas supply hole 410a is arranged vertically. Thus, a source gas serving as a process gas is emitted (supplied) toward the upper region of the process chamber 201 via the gas supply hole 410a of the first nozzle 410. Gas supply holes via which the source gas is emitted (supplied) are not installed at side surfaces of the first nozzle 410.

The first nozzle 410 may be installed in the lower region (bottom region) of the process chamber 201. However, the first nozzle 410 is preferably installed in a region of the process chamber 201 in which the source gas supplied via the gas supply hole 410a is not substantially pyrolyzed (i.e., a region of the process chamber 201 other than the uniform temperature region thereof).

The first nozzle 410 preferably extends up to a position corresponding to the bottom of the boat 217 to be described below, preferably extends up to a position facing the vicinity of a boundary between a product wafer and a dummy wafer to be described below, and preferably extends up to at least a position below a position facing the product wafer (a position facing the dummy wafer).

(Second Nozzle)

The second nozzle 420 is installed to extend from the lower region of the process chamber 201 up to middle regions of the wafers 200 accommodated in the process chamber 201. A plurality of gas supply holes 420a (second gas supply holes) are installed at a position facing the wafers 200. That is, the gas supply holes 420a are open toward the center of the inner tube 204. The source gas serving as a process gas is supplied onto the wafers 200 via the plurality of gas supply holes 420a of the second nozzle 420. The plurality of gas supply holes 420a are installed to have the same opening area and the same pitch. However, the gas supply holes 420a are not limited to the above-described configuration. For example, the opening areas of the respective gas supply holes 420a may gradually increase from the bottom of the inner tube 204 to the top thereof. Thus, a flow rate of a gas to be supplied via the gas supply holes 420a may be more uniform.

The plurality of gas supply holes 420a of the second nozzle 420 are installed to correspond to the bottom and middle of the boat 217 to be described below (i.e., within the uniform temperature region). Thus, the source gas supplied via the gas supply holes 420a of the second nozzle 420 is supplied onto the wafers 200 accommodated at the bottom and middle of the boat 217.

The nozzle 420 preferably extends up to a position corresponding to the middle of the boat 217 to be described below, more preferably extends up to a position corresponding to a middle portion of a region in which a product wafer to be described below is provided, and most preferably extends up to the middle region of the process chamber 201.

(Third Nozzle)

The third nozzle 430 is installed to extend from the lower region of the process chamber 201 up to the upper region thereof. A plurality of gas supply holes (third gas supply holes) 430a are installed at a position facing the wafers 200. That is, the gas supply holes 430a are open toward the center of the inner tube 204. A reactive gas is supplied onto the wafers 200 via the gas supply holes 430a of the third nozzle 430. The plurality of gas supply holes 430a are installed from the bottom of the inner tube 204 to the top thereof, and are installed to have the same opening area and the same pitch. However, the gas supply holes 430a are not limited to the above-described configuration. For example, the opening areas of the gas supply holes 430a may gradually increase from the bottom of the inner tube 204 to the top thereof. Thus, a flow rate of a gas to be supplied via the gas supply holes 430a may be more uniform.

The plurality of gas supply holes 430a of the third nozzle 430 are installed at positions corresponding to the bottom, middle and top of the boat 217 to be described below. Thus, a reactive gas which is a process gas supplied into the process chamber 201 via the plurality of gas supply holes 430a of the third nozzle 430 is supplied onto the wafers 200 accommodated on the bottom, middle and top of the boat 217, i.e., all the wafers 200 accommodated in the boat 217.

The nozzle 430 preferably extends from the lower region of the process chamber 201 up to the upper region thereof but may be installed to extend up to the vicinity of a ceiling of the boat 217.

By opening the valve 314 and closing the valve 324, the source gas serving as a process gas and including a first element is supplied into the process chamber 201 via the MFC 312, the valve 314 installed at the gas supply pipe 310 and the nozzle 410. In addition, by opening the valve 324 and closing the valve 314, the source gas is supplied into the process chamber 201 via the MFC 312, the valve 324 installed at the gas supply pipe 320 and the nozzle 420. For example, trimethylaluminum ($Al(CH_3)_3$, abbreviated as 'TMA') which is an aluminum (Al)-containing source (an Al-containing source gas, an Al-containing gas) which is a metal-containing source gas (a metal-containing gas) including Al (a metal element) as the first element is used as the source gas. The TMA is an organic-based material and is alkyl aluminum in which an alkyl group is bound to aluminum.

An oxygen-containing gas (an oxidizing gas, an oxidant) which is a reactive gas (a reactant) including oxygen (O) serving as a process gas and reacting with Al is supplied into the process chamber 201 via the WC 332 and the valve 334 installed at the gas supply pipe 330 and the nozzle 430. The O-containing gas includes, for example, ozone ($O_3$) gas.

According to the present embodiment, the source gas which is a metal-containing gas is supplied into the process chamber 201 via the gas supply holes 410a and 420a of the nozzles 410 and 420, and the reactive gas which is an oxygen-containing gas is supplied into the process chamber 201 via the gas supply holes 430a of the nozzle 430. Thus, the source gas (metal-containing gas) and the reactive gas (oxygen-containing gas) are supplied onto surfaces of the wafers 200, thereby forming a metal oxide film on the surfaces of the wafers 200.

An inert gas such as nitrogen ($N_2$) gas is supplied into the process chamber 201 via the MFCs 512, 522 and 532 and the valves 514, 524 and 534 respectively installed at the gas supply pipes 510, 520 and 530 connected to the gas supply pipes 310, 320 and 330, and the nozzles 410, 420 and 430. The inert gas supplied via the gas supply pipes 510, 520 and 530 acts as a purge gas, a dilution gas (D-$N_2$) or a carrier gas in a substrate processing process to be described below.

When a compound, such as TMA, which is in a liquid state under normal temperature and pressure conditions is used as a process gas, TMA that is in the liquid state is vaporized by a vaporizer or a vaporizing system such as a bubbler and is then supplied as TMA gas into the process chamber 201.

A process gas supply system includes the gas supply pipes 310, 320 and 330, the MFCs 312 and 332, the valves 314, 324 and 334, and the nozzles 410, 420 and 430. The process gas supply system may be considered to only include the nozzles 410, 420 and 430. The process gas supply system is also referred to simply as a gas supply system.

A source gas supply system includes the gas supply pipes 310 and 320, the WC 312, and the valves 314 and 324 when the source gas flows in the gas supply pipes 310 and 320, but may only include the nozzles 410 and 420. The source gas supply system is also referred to as a source supply system. When the source gas includes a metal-containing source gas, the source gas supply system may also be referred to as a metal-containing source gas supply system. When the metal-containing source gas includes an aluminum-containing source gas, the metal-containing source gas supply system may also be referred to as an aluminum-containing source gas supply system. When the aluminum-containing source gas contains TMA, the aluminum-containing source gas supply system may also be referred to as a TMA supply system.

A reactive gas supply system includes the gas supply pipe 330, the WC 332 and the valve 334 when the reactive gas flows in the gas supply pipe 330 but may only include the nozzle 430. When an oxygen-containing gas serving as a reactive gas is supplied via the gas supply pipe 330, the reactive gas supply system may also be referred to as an oxygen-containing gas supply system. When the oxygen-containing gas includes $O_3$, the oxygen-containing gas supply system may also be referred to as an $O_3$ supply system.

An inert gas supply system includes the gas supply pipes 510, 520 and 530, the MFCs 512, 522 and 532, and the valves 514, 524 and 534. The inert gas supply system may be referred to as a purge gas supply system, a dilution gas supply system, or a carrier gas supply system.

According to the present embodiment, a gas is supplied via the nozzles 410, 420 and 430 arranged in the spare chamber 201a inside a ring-shaped and vertically long space defined by the inner walls of the inner tube 204 and ends of the wafers 200, i.e., a cylindrical space. The gas is emitted into the inner tube 204 via the gas supply hole 410a installed at a front end of the nozzle 410 and the plurality of gas supply holes 420a and 430a of the nozzles 420 and 430 installed at positions facing the wafers 200. More specifically, the source gas is emitted toward the top of the inner tube 204 via the gas supply hole 410a of the nozzle 410, and is emitted in parallel with surfaces of the wafers 200, i.e., in a horizontal direction, via the gas supply holes 420a of the nozzle 420 and the gas supply holes 430a of the nozzle 430. The source gas supplied via the gas supply hole 410a of the nozzle 410 is likely to be consumed at circumferential portions of the wafers 200 and is thus difficult to arrive at the centers of the wafers 200. When the flow rate of the source gas is increased, the source gas may more easily arrive at the centers of the wafers 200. The source gas supplied via the gas supply holes 420a of the nozzle 420 and the reactive gas supplied via the gas supply holes 430a of the nozzle 430 have directivity toward the centers of the wafers 200 and may thus easily arrive at the centers of the wafers 200, thereby improving the uniformity of a film.

According to the present embodiment, the nozzles 410 and 420 configured to supply the source gas into the inner tube 204 are installed. By supplying the source gas into the inner tube 204 via the nozzles 410 and 420, a film is formed on the wafers 200. By controlling the sum of the flow rates of the inert gas which is a dilution gas (or a carrier gas) and the source gas supplied via the gas supply pipe 510, the source gas supplied via the gas supply hole 410a of the nozzle 410 is supplied onto a wafer 200 stacked at an arbitrary height within the boat 217. The sum of the flow rate of the TMA gas and the flow rate of the inert gas may be controlled by controlling the flow rate of the TMA gas, controlling the flow rate of the inert gas, or controlling the flow rates of both of the TMA gas and the inert gas. As the sum of the flow rates of the TMA gas and the inert gas increases, a larger amount of the TMA gas supplied via the gas supply hole 410a of the nozzle 410 may be supplied to the upper region of the process chamber 201. As the sum of the flow rates of the TMA gas and the inert gas decreases, a larger amount of the TMA gas supplied via the gas supply hole 410a of the nozzle 410 may be supplied to the lower region of the process chamber 201. According to the present embodiment, the TMA gas supplied via the gas supply hole 410a of the nozzle 410 is supplied to the upper region of the process chamber 201 by controlling the flow rate of the inert gas. For example, as the flow rate of the inert gas decreases, a larger amount of the source gas is supplied onto the wafers 200 accommodated on the bottom of the boat 217. As the flow rate of the inert gas increases, a larger amount of the source gas is supplied onto the wafers 200 accommodated on the top of the boat 217. According to the present embodiment, the flow rate of the inert gas supplied via the gas supply pipe 510 is controlled such that the source gas supplied via the gas supply hole 410a of the nozzle 410 is supplied onto mainly the wafers 200 accommodated on the middle and top of the boat 217. Furthermore, the source gas supplied via the gas supply holes 420a of the nozzle 420 is supplied onto the wafers 200 accommodated on the bottom and middle of the boat 217.

Thus, since a sufficient amount of the source gas is supplied onto the wafers 200 accommodated on the bottom, middle and top of the boat 217, a film may be efficiently formed and the uniformity of a film to be formed on the wafers 200 accommodated in the process chamber 201 may be improved. Furthermore, since the source gas is sufficiently supplied onto the wafers 200 accommodated on the bottom of the boat 217, the uniformity of a film to be formed on, particularly, the wafers 200 on the bottom of the boat 217 may be improved.

An exhaust hole (exhaust port) 204a is a through-hole formed at a position of the sidewalls of the inner tube 204 facing the nozzles 410, 420 and 430, i.e., a position opposite by 180 degrees to the spare chamber 201a. An example of the exhaust hole 204a includes a slit which is slender and long in a vertical direction. Thus, a gas supplied into the process chamber 201 via the gas supply holes 410a, 420a and 430a of the nozzles 410, 420 and 430 and flowing through the surfaces of the wafers 200, i.e., a remnant gas (a residual gas), flows in an exhaust channel 206 which is a gap between the inner tube 204 and the outer tube 203 via the exhaust hole 204a. The gas flowing in the exhaust channel 206 flows into an exhaust pipe 231 and is then discharged out of the process furnace 202.

The exhaust hole 204a is installed at a position facing the wafers 200 (preferably, positions corresponding to the top, middle and bottom of the boat 217). A gas supplied near the wafers 200 in the process chamber 201 via the gas supply holes 410a, 420a and 430a flows in the horizontal direction, i.e., a direction parallel to the surfaces of the wafers 200, and then flows in the exhaust channel 206 via the exhaust hole 204a. That is, a gas remaining in the process chamber 201 is exhausted in parallel with main surfaces of the wafers 200 via the exhaust hole 204a. Furthermore, the exhaust hole 204a is not limited to a slit-shaped through-hole and may include a plurality of holes.

The exhaust pipe 231 which exhausts an internal atmosphere of the process chamber 201 is installed at the manifold 209. A pressure sensor 245 serving as a pressure detector (pressure detection unit) for detecting an internal pressure of the process chamber 201, an auto pressure controller (APC) valve 243 and a vacuum pump 246 which is a vacuum exhaust device are sequentially connected to the exhaust pipe 231 from an upstream end of the exhaust pipe 231 to a downstream end thereof. The inside of the process chamber 201 may be vacuum-exhausted or the vacuum-exhausting of the inside of the process chamber 201 may be stopped by opening or closing the APC valve 243 in a state in which the vacuum pump 246 is operated. The internal pressure of the process chamber 201 may be controlled by controlling an opening degree of the APC valve 243 in a state in which the vacuum pump 246 is operated. An exhaust system, i.e., an exhaust line, includes the exhaust hole 204a, the exhaust channel 206, the exhaust pipe 231, the APC valve 243 and the pressure sensor 245. The exhaust system may also further include the vacuum pump 246.

A seal cap 219 is a furnace port lid for air-tightly blocking a lower end opening of the manifold 209 and is installed below the manifold 209. The seal cap 219 is vertically connected to the bottom of the manifold 209. The seal cap 219 is formed of, for example, a metal material such as SUS, and is disk-shaped. An O-ring 220b which is a seal member connected to the bottom of the manifold 209 is installed on a top surface of the seal cap 219. A rotating mechanism 267 which rotates the boat 217 for accommodating the wafers 200 is installed at a position opposite the seal cap 219. A pivot 255 of the rotating mechanism 267 penetrates the seal cap 219 to be connected to the boat 217. The rotating mechanism 267 rotates the boat 217, and the wafers 200 are rotated as the boat 217 is rotated. The seal cap 219 is moved in the vertical direction by a boat elevator 115 which is a lifting device vertically installed outside the outer tube 203.

The boat elevator 115 moves the seal cap 219 up or down, and the boat 217 may be loaded into or unloaded from the process chamber 201 as the seal cap 219 is moved up or down. The boat elevator 115 is a transfer device (transfer mechanism) configured to transfer the boat 217 and the wafers 200 accommodated in the boat 217 into or out of the process chamber 201.

The boat 217 which is a substrate support mechanism is configured to support a plurality of wafers 200, e.g., 25 to 200 wafers 200, in a multistage manner such that they are vertically arranged concentrically with one another in a horizontal posture. That is, the boat 217 is configured to support the plurality of wafers 200 to be spaced apart from one another. The boat 217 is formed of, for example, a heat-resistant material such as quartz and SiC. Insulation boards 218 formed of a heat-resistant material such as quartz and SiC are supported below the boat 217 in a horizontal posture and in a multistage manner. Heat generated by the heater 207 is prevented from being transferred to the seal cap 219 due to the insulation boards 218. However, the present embodiment is not limited to the above-described configuration. An insulating container (not shown) formed of a heat-resistant material such as quartz and SiC and configured as a cylindrical member may be installed below the boat 217 instead of the insulation boards 218.

According to the present embodiment, the plurality of wafers 200 supported in the boat 217 may be classified as product wafers and dummy wafers according to functions (roles) thereof. The product wafers are wafers as products to be on the market after a film-forming process is performed thereon, and may be, for example, wafers accommodated on the bottom, middle and top of the boat 217.

The dummy wafers are dummies with respect to the product wafers, and are disposed above, below, or between the product wafers. The dummy wafers are disposed, for example, near the ceiling or bottom of the boat 217. The dummy wafers are used to decrease non-uniformity in surface temperature of the product wafers or to control the distances between the product wafers to be film-processed (to control pitches of the product wafers to be the same at any locations).

Figure 2:
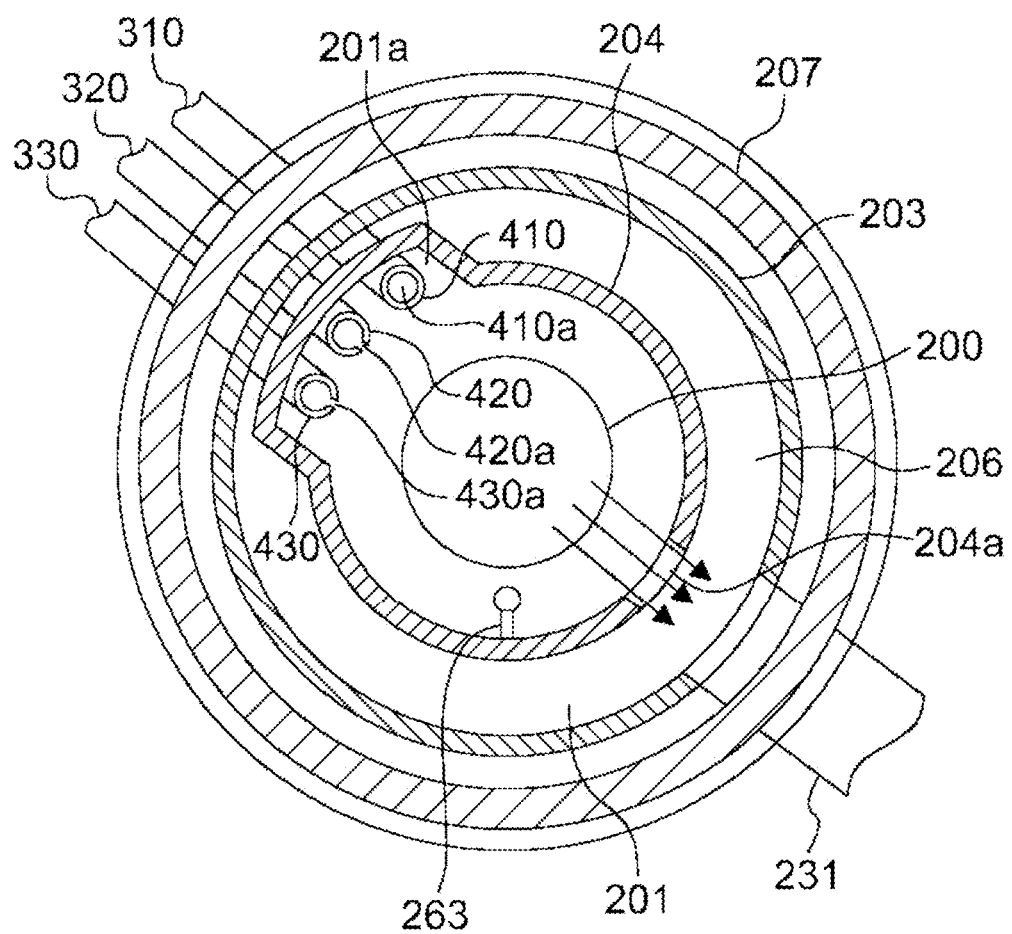
FIG. 2 is a schematic cross-sectional view taken along line A-A of FIG. 1.

As illustrated in FIG. 2, a temperature sensor 263 which is a temperature detector is installed in the inner tube 204. An internal temperature of the process chamber 201 may have a desired temperature distribution by controlling an amount of electric current to be supplied to the heater 207 on the basis of temperature information detected by the temperature sensor 263. The temperature sensor 263 has an L shape similar to the nozzles 410, 420 and 430 and is installed along the inner walls of the inner tube 204.

Figure 3:
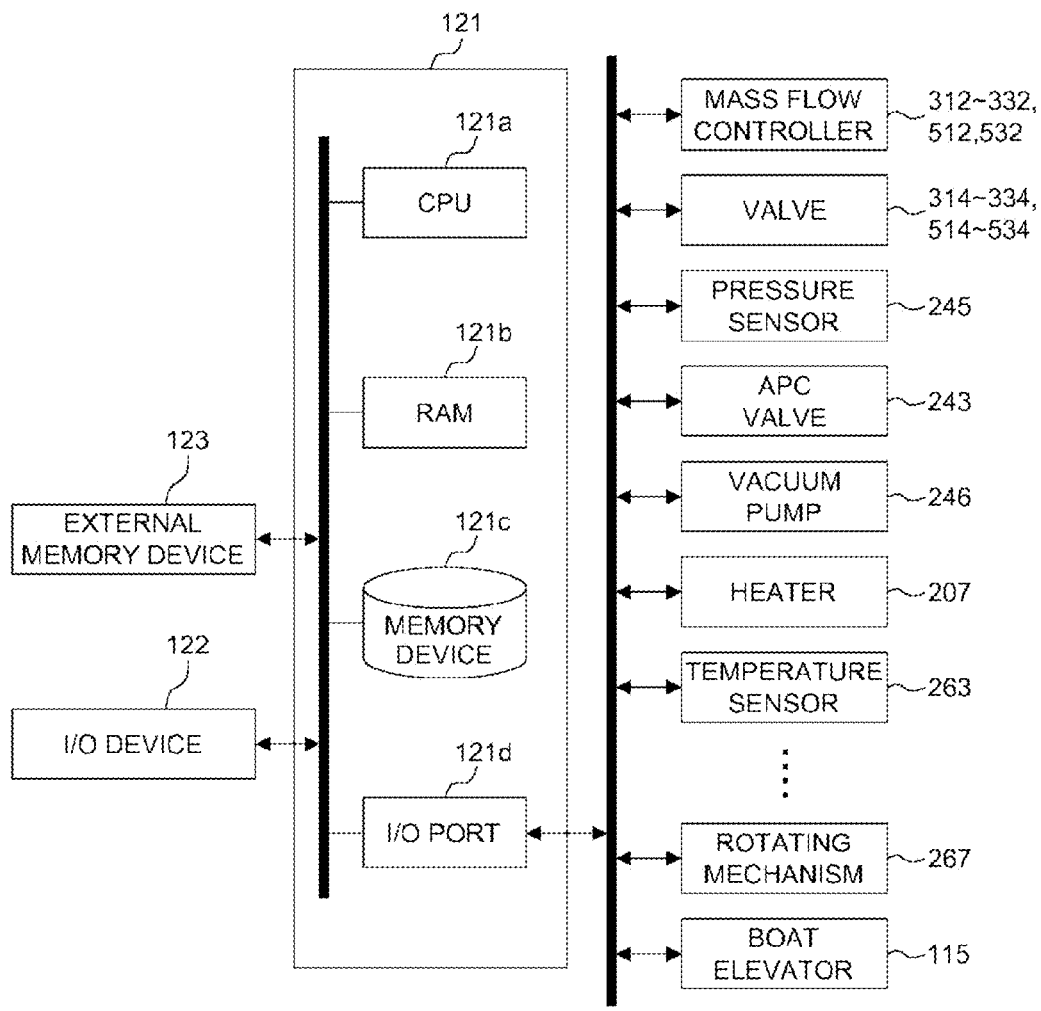
FIG. 3 is a schematic configuration diagram of a controller of the substrate processing apparatus according to the first embodiment, in which a block diagram of a control system of the controller is shown.

As illustrated in FIG. 3, a controller 121 which is a control unit (control means) is embodied by a computer including a central processing unit (CPU) 121a, a random access memory (RAM) 121b, a memory device 121c and an input/output (I/O) port 121d. The RAM 121b, the memory device 121c and the I/O port 121d may exchange data with the CPU 121a via an internal bus. An I/O device 122, such as a touch panel, may be connected to the controller 121.

The memory device 121c is embodied by, for example, a flash memory or a hard disk drive (HDD). In the memory device 121c, a control program for controlling an operation of a substrate processing apparatus, a process recipe including the order or conditions of a semiconductor device manufacturing method to be described below, and the like are stored to be readable. The process recipe is a combination of processes (steps) of the semiconductor device manufacturing method to be described below to obtain a desired result when the precesses are performed by the controller 121, and acts as a program. Hereinafter, the process recipe, the control program, and the like will be referred to together simply as a 'program.' In the present disclosure, the term 'program' may be understood as including only the process recipe, only the control program, or a combination of the process recipe and the control program. The RAM 121b functions as a memory area (work area) in which a program or data read by the CPU 121a is temporarily stored.

The I/O port 121d is connected to the MFCs 512, 522, 532, 312 and 332, the valves 514, 524, 534, 314, 324 and 334, the pressure sensor 245, the APC valve 243, the vacuum pump 246, the heater 207, the temperature sensor 263, the rotating mechanism 267, and the boat elevator 115 described above.

The CPU 121a is configured to read and execute the control program from the memory device 121c, and to read the process recipe and the like from the memory device 121c according to a manipulation command received via the I/O device 122. Hereinafter, for convenience of description, the process recipe may also be referred to simply as a 'recipe'. The CPU 121a is configured to, based on the read process recipe, control the flow rates of various gases using the MFCs 312, 332, 512, 522 and 532, control opening/closing of the valves 314, 324, 334, 514, 524 and 534, control pressure by opening/closing of the APC valve 243 and using the APC valve 243 on the basis of the pressure sensor 245, control temperature using the heater 207 on the basis of the temperature sensor 263, control driving/suspending of the vacuum pump 246, control the rotation and rotation speed of the boat 217 using the rotating mechanism 267, control moving of the boat 217 upward/downward using the boat elevator 115, control accommodating of the wafers 200 in the boat 217, etc.

As described above, the CPU 121a is configured to control the flow rates of various gases using the MFCs 312, 332, 512, 522 and 532, opening/closing of the valves 314, 324 and 334, 514, 524 and 534, and so on. Thus, supplying the source gas upward via the gas supply hole 410a by controlling the source gas supply system and the reactive gas supply system, supplying the source gas to the wafers 200 via the plurality of gas supply holes 420a, supplying the reactive gas to the wafers 200 via the plurality of gas supply holes 430a, and the like are performed by the controller 121 which is a control unit (control means). Furthermore, exhausting the source gas remaining in the process chamber 201 via the exhaust hole 204a to be parallel with the main surfaces of the wafers 200 by controlling the exhaust system, exhausting the reactive gas remaining in the process chamber 201 via the exhaust hole 204a to be parallel with the main surfaces of the wafers 200, and the like are performed by the controller 121 which is a control unit (control means).

The controller 121 may be embodied by installing, in a computer, the above program stored in an external memory device 123, e.g., a magnetic tape, a magnetic disk (e.g., a flexible disk, a hard disk, etc.), an optical disc (e.g., a compact disc (CD), a digital versatile disc (DVD), etc.), a magneto-optical (MO) disc, or a semiconductor memory (e.g., a Universal Serial Bus (USB) memory, a memory card, etc.). The memory device 121c or the external memory device 123 may be embodied as a non-transitory computer-readable recording medium. Hereinafter, the memory device 121c and the external memory device 123 may also be referred to together simply as a 'recording medium.' In the present disclosure, the term 'recording medium' may be understood as including only the memory device 121c, only the external memory device 123, or both of the memory device 121c and the external memory device 123. A program may be supplied to a computer using a communication means such as the Internet or an exclusive line without using the external memory device 123.

[Substrate Processing Process (Film-Forming Process)]

Figure 10A:
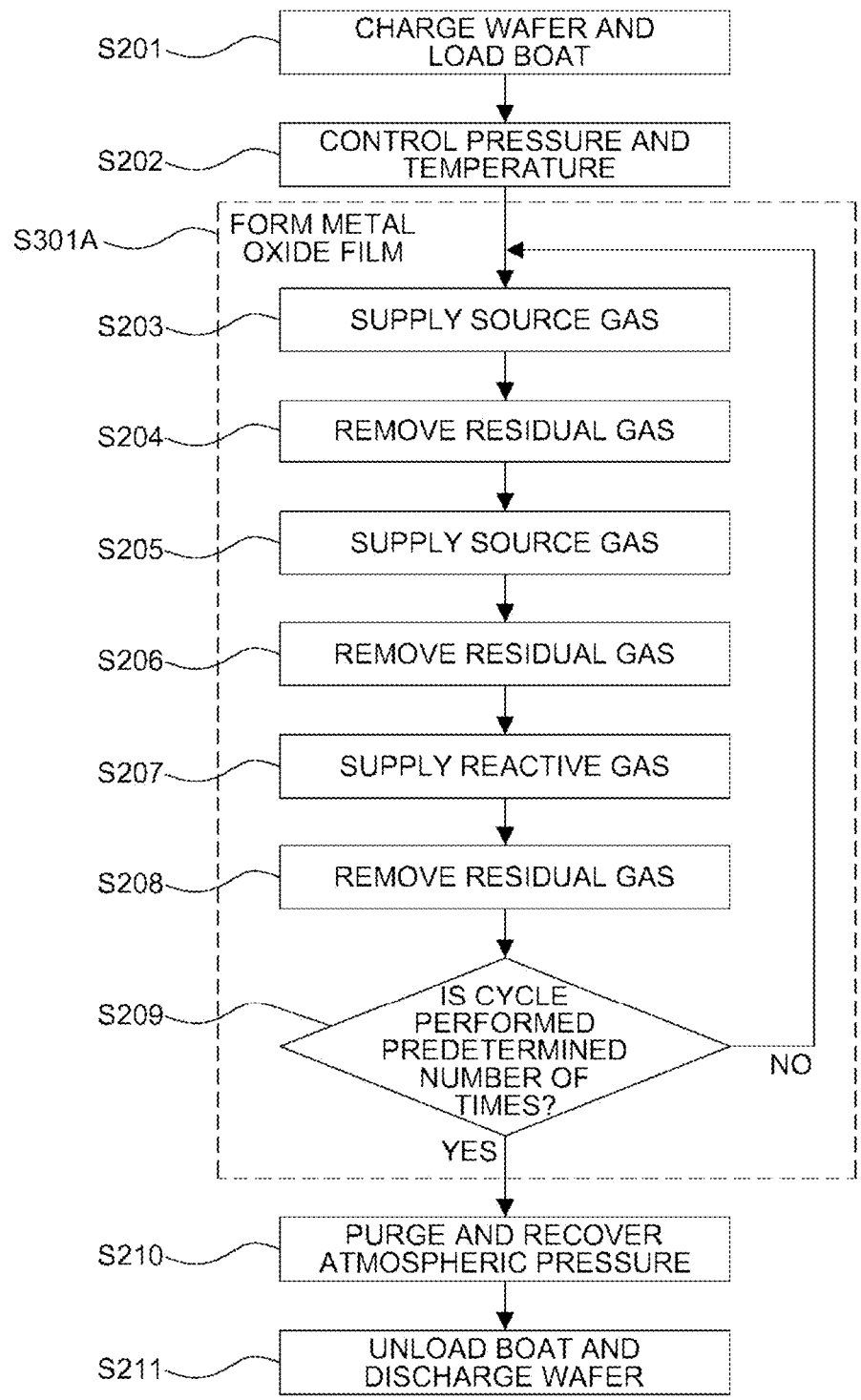

Next, an example of a method of manufacturing a semiconductor device (device) by forming a thin film on the wafers 200 accommodated in the process chamber 201 using the process furnace 202 of the substrate processing apparatus 10 described above will be described with reference to FIG. 10A. FIG. 10A is a flowchart of a method of manufacturing a semiconductor device according to the first embodiment of the present invention. In a description below, operations of various elements constituting the substrate processing apparatus 10 are controlled by the controller 121.

In the method of manufacturing a semiconductor device according to the first embodiment, a thin film is formed on the wafers 200 by performing accommodating the wafers 200 stacked in a vertical direction in the process chamber 201, supplying a source gas to the wafers 200 by supplying a source gas upward via the gas supply hole 410a of the nozzle 410 (first process), supplying the source gas to the wafers 200 via the gas supply holes 420a of the nozzle 420 (second process), and supplying a reactive gas to the wafers 200 via the gas supply holes 430a of the nozzle 430 (third process). In the first embodiment, when the source gas is a metal-containing gas and the reactive gas is an oxygen-containing gas, a metal oxide film is formed on the wafers 200 by performing the above processes.

The first to third processes are sequentially performed a predetermined number of times. Here, the expression "the first to third processes are performed a predetermined number of times" should be understood as performing the first to third processes once or more, and preferably as repeatedly performing the first to third processes a plurality of times (twice or more).

In the present disclosure, the term "wafer" should be understood as either the wafer itself or both the wafer and a stacked structure (assembly) including a layer/film formed on a surface of the wafer (i.e., the wafer and the layer/film formed thereon may also be collectively referred to as the 'wafer'). The expression "surface of the wafer" should be understood as either a surface (exposed surface) of the wafer itself or a surface of a layer/film formed on the wafer, i.e., an uppermost surface of the wafer as a stacked structure.

Thus, in the present disclosure, the expression "specific gas is supplied onto a wafer" should be understood to mean that the specific gas is directly supplied onto a surface (exposed surface) of the wafer or that the specific gas is supplied onto a surface of a layer/film formed on the wafer, i.e., on the uppermost surface of the wafer as a stacked structure. In the present disclosure, the expression "a layer/film is formed on a wafer" should be understood to mean that the layer/film is directly formed on a surface (exposed surface) of the wafer itself or that the layer/film is formed on a surface of the layer/film formed on the wafer, i.e., on an uppermost surface of the wafer as a stacked structure.

In the present disclosure, the "wafer" is an example of a substrate. A method of manufacturing a semiconductor device according to the present embodiment will be described in detail below.

[Wafer Charging and Boat Loading (S201)]

First, the wafers 200 are placed in the boat 217 (wafer charging). Thereafter, as illustrated in FIG. 1, the boat 217 accommodating the wafers 200 therein is lifted by the boat elevator 115 and is loaded into the process chamber 201

(boat loading). In this state, the seal cap 219 blocks the lower end opening of the manifold 209 via the O-ring 220b.

[Pressure and Temperature Control (S202)]

The process chamber 201 is vacuum-exhausted by the vacuum pump 246 such that an internal pressure of the process chamber 201, i.e., an internal pressure of a space of the process chamber 201 in which the wafers 200 are present, has a desired pressure (degree of vacuum). In this case, the internal pressure of the process chamber 201 is measured by the pressure sensor 245, and the APC valve 243 is feedback-controlled on the basis of information regarding the measured pressure (pressure control). The vacuum pump 246 is continuously operated at least until processing of the wafers 200 is completed. The process chamber 201 is heated by the heater 207 such that an internal temperature of the process chamber 201 reaches a desired temperature. In this case, an amount of electric current to be supplied to the heater 207 is feedback-controlled on the basis of temperature information detected by the temperature sensor 263 such that the internal temperature of the process chamber 201 has a desired temperature distribution (temperature control). The heater 207 continuously heats the process chamber 201 until the processing of the wafers 200 is completed. Next, rotating of the boat 217 and the wafers 200 by the rotating mechanism 267 is started. The rotating mechanism 267 continuously rotates the boat 217 and the wafers 200 until the processing of the wafers 200 is completed.

Next, formation of a metal oxide film is performed. Formation of an aluminum oxide film ($Al_2O_3$ film) which is a metal oxide film by supplying TMA as a source gas and supplying ozone gas as a reactive gas will be described below, but the present invention is not limited thereto.

[Formation of a Metal Oxide Film (S301A)]

First, formation of the metal oxide film (S301A) will be described, in which supplying the source gas (S203) (first process), removing a residual gas (S204), supplying the source gas (S205) (second process), removing a residual gas (S206), supplying the reactive gas (S207) (third process), and removing a residual gas (S208) are sequentially performed a predetermined number of times. These steps are performed in order without mixing the source gas and the reactive gas.

[Supplying of the Source Gas (S203)]

By opening the valve 314, trimethylaluminum (TMA) gas serving as the source gas is supplied into the gas supply pipe 310. A flow rate of the TMA gas flowing tin the gas supply pipe 310 is adjusted to a first TMA gas flow rate (first source gas flow rate) by the MFC 312. When the TMA gas flows in the gas supply pipe 310, an inert gas such as $N_2$ gas serving as a carrier gas flows in the gas supply pipe 510 by opening the valve 514. A flow rate of the inert gas flowing in the gas supply pipe 510 is adjusted to a first inert gas flow rate by the MFC 512. The TMA gas with the flow rate thereof adjusted and the inert gas with the flow rate thereof adjusted are supplied into the process chamber 201 via the gas supply hole 410a of the nozzle 410, and are exhausted via the exhaust pipe 231. In this case, the TMA gas and the inert gas are supplied onto the wafers 200. That is, surfaces of the wafers 200 are exposed to the TMA gas and the inert gas.

In this case, by adjusting the sum of the flow rates of the TMA gas and the inert gas, the TMA gas supplied via the gas supply hole 410a of the nozzle 410 is supplied to the upper region of the process chamber 201. The sum of the flow rates of the TMA gas and the inert gas may be adjusted by adjusting the flow rate of the TMA gas, the flow rate of the inert gas, or both of the flow rates of the TMA gas and the inert gas. As the sum of the flow rates of the TMA gas and the inert gas increases, a larger amount of the TMA gas may be supplied to the upper region of the process chamber 201 via the gas supply hole 410a of the nozzle 410. As the sum of the flow rates of the TMA gas and the inert gas decreases, a larger amount of the TMA gas may be supplied to the lower region of the process chamber 201 via the gas supply hole 410a of the nozzle 410. According to the present embodiment, the TMA gas supplied via the gas supply hole 410a of the nozzle 410 is supplied to the upper region of the process chamber 201 by adjusting the flow rate of the inert gas. That is, the flow rate of the inert gas is adjusted to adjust the sum of the flow rates of the TMA gas and the inert gas to a flow rate of the TMA gas to be supplied to the upper region of the process chamber 201 via the gas supply hole 410a of the nozzle 410. In this case, in order to prevent the TMA gas from flowing into the nozzles 420 and 430, the valves 524 and 534 are opened to flow the inert gas into the gas supply pipe 520 and the gas supply pipe 530. The inert gas is supplied into the process chamber 201 via the gas supply pipe 320, the gas supply pipe 330, and the nozzles 420 and 430, and is exhausted via the exhaust pipe 231.

In this case, the APC valve 243 is appropriately controlled to adjust the internal pressure of the process chamber 201. The internal pressure of the process chamber 201 ranges, for example, from 1 Pa to 1000 Pa, preferably, ranges from 1 Pa to 100 Pa, and more preferably ranges from 10 Pa to 40 Pa. When the internal pressure of the process chamber 201 is 1000 Pa or less, removing a residual gas to be described below may be preferably performed. When the internal pressure of the process chamber 201 is 1 Pa or more, a reaction rate of the TMA gas at surfaces of the wafers 200 may be high.

The flow rate of the TMA gas supplied into the process chamber 201 via the gas supply hole 410a of the nozzle 410 is controlled by the MFC 312. The flow rate of the TMA gas ranges, for example, from 10 sccm to 500 sccm, preferably ranges from 50 sccm to 300 sccm, and more preferably ranges from 50 sccm to 150 sccm. When the flow rate of the TMA gas is 500 sccm or less, removing the residual gas to be described below may be preferably performed. When the flow rate of the TMA gas is 10 sccm or more, a reaction rate of the TMA gas at the surfaces of the wafers 200 may be improved.

When the TMA gas is supplied into the process chamber 201 via the gas supply hole 410a of the nozzle 410, a flow rate of $N_2$ gas supplied into the process chamber 201 via the gas supply hole 410a of the nozzle 410 is controlled by the MFC 512. The flow rate of the $N_2$ gas ranges, for example, from 10 slm to 30 slm, preferably ranges from 10 slm to 20 slm, and more preferably ranges from 15 slm to 20 slm. When the flow rate of the $N_2$ gas is 30 slm or less, a reaction rate of the TMA gas may be improved. When the flow rate of the $N_2$ gas is 10 slm or more, the TMA gas may be efficiently supplied to the upper region of the process chamber 201 and removing the residual gas to be described below may be preferably performed.

A time duration of supplying the TMA gas to the wafers 200 (a time duration of supplying the TMA gas toward the upper region of the process chamber 201 via the gas supply hole 410a), i.e., a gas supply duration (a gas emission time), ranges, for example, 1 to 60 seconds, preferably ranges from 1 to 30 seconds, and more preferably ranges from 3 to 5 seconds. When the gas supply duration is 60 seconds or less, an increase in resistivity due to permeation of impurities into a film is suppressed. When the gas supply duration is 1 second or more, a film-forming rate may be improved.

The heater 207 heats the internal temperature of the process chamber 201 (temperature of the wafers 200) to range, for example, from 400° C. to 600° C., preferably range from 400° C. to 550° C., and more preferably range from 450° C. to 550° C. When the internal temperature of the process chamber 201 is 600° C. or less, the TMA gas may be suppressed from being pyrolyzed, thereby appropriately adjusting the film-forming rate, and an increase in resistivity due to permeation of impurities into a film may be suppressed. Furthermore, since pyrolyzing of the TMA gas starts at about 550° C., the present invention may be efficiently applied when the internal temperature of the process chamber 201 is heated to 550° C. or less. When the internal temperature of the process chamber 201 is 400° C. or more, reactivity of the TMA gas at the surfaces of the wafers 200 is high and a film may be efficiently formed. The TMA gas and the inert gas ($N_2$ gas) are only supplied into the process chamber 201. By supplying the TMA gas, for example, an Al-containing layer having a thickness of about less than one atomic layer to several atomic layers is formed on the wafers 200 accommodated on the middle and top of the boat 217.

[Removal of Residual Gas (S204)]

After the Al-containing layer is formed on the wafers 200 accommodated on the middle and top of the boat 217 among the wafers 200, the valve 314 is closed to stop the supplying of the TMA gas via the gas supply hole 410a of the nozzle 410. An internal atmosphere of the process chamber 201 is vacuum-exhausted by the vacuum pump 246 in a state in which the APC valve 243 of the exhaust pipe 231 is open. The TMA gas (that did not react or that has contributed to the formation of the Al-containing layer) remaining in the process chamber 201 is removed by being exhausted to be parallel with main surfaces of the wafers 200 via the exhaust hole 204a. Furthermore, an inert gas is supplied into the process chamber 201 in a state in which the valves 514, 524 and 534 are open. The inert gas serves as a purge gas. An effect of removing the TMA gas (that did not react or that has contributed to the formation of the Al-containing layer) remaining in the process chamber 201 from the process chamber 201 may be improved by the purge gas. While the Removal of the residual gas is performed, the inert gas may be supplied continuously or discontinuously (in a pulsation manner) using the valves 514, 524 and 534.

In this case, a gas remaining in the process chamber 201 may not be completely removed and the inside of the process chamber 201 may not be completely purged. When the amount of the gas remains in the process chamber 201 is small, a subsequent process will not be negatively influenced by the gas. Also, the flow rate of the inert gas to be supplied into the process chamber 201 needs not be high. For example, the inside of the process chamber 201 may be purged without causing the subsequent process to be negatively influenced by the gas by supplying an amount of the inert gas corresponding to, for example, the capacity of inner tube 204 (the capacity of the process chamber 201). When the inside of the process chamber 201 is not completely purged, a purge time may be reduced to improve the throughput. Furthermore, the consumption of the inert gas may be reduced to a minimum level.

[Supplying of Source Gas (S205)]

After the residual gas is removed from the inside of the process chamber 201, the valve 324 is opened to supply trimethylaluminum (TMA) gas serving as a source gas to the gas supply pipe 320 (the second process). A flow rate of the TMA gas flowing in the gas supply pipe 320 is controlled by the MFC 312. When the TMA gas flows in the gas supply pipe 320, an inert gas such as $N_2$ gas is supplied into the gas supply pipe 520 by opening the valve 524. A flow rate of the inert gas flowing in the gas supply pipe 520 is controlled by the MFC 522. The TMA gas with the flow rate thereof adjusted and the inert gas with the flow rate thereof adjusted are supplied to the lower region of the process chamber 201 to the middle region thereof via the gas supply holes 420a of the nozzle 420. That is, the TMA gas and the inert gas are supplied onto the wafers 200 accommodated on the bottom and middle of the boat 217. In this case, in order to prevent the TMA gas from flowing into the nozzle 410 and the nozzle 430, the valves 514 and 534 are opened to supply the inert gas into the gas supply pipe 510 and the gas supply pipe 530. The inert gas is supplied into the process chamber 201 via the gas supply pipe 310, the gas supply pipe 330 and the nozzles 410 and 430, and is exhausted via the exhaust pipe 231.

In this case, the APC valve 243 is appropriately controlled to adjust the internal pressure of the process chamber 201 to range, for example, from 1 Pa to 1000 Pa, preferably range from 1 Pa to 100 Pa, and more preferably range from 10 Pa to 40 Pa. When the internal pressure of the process chamber 201 is 1000 Pa or less, removing a residual gas to be described below may be preferably performed. When the internal pressure of the process chamber 201 is 1 Pa or more, a reaction rate of the TMA gas at the surfaces of the wafers 200 may be improved.

A flow rate of the TMA gas supplied into the process chamber 201 via the gas supply holes 420a of the nozzle 420 is controlled by the MFC 312 to range, for example, from 10 sccm to 500 sccm, preferably range from 50 sccm to 300 sccm, and more preferably range from 50 sccm to 150 sccm. When the flow rate of the TMA gas is 500 sccm or less, removing the residual gas to be described below may be preferably performed. When the flow rate of the TMA gas is 10 sccm or more, a reaction rate of the TMA gas at the surfaces of the wafers 200 may be improved.

When the TMA gas is supplied into the process chamber 201 via the gas supply holes 420a of the nozzle 420, a flow rate of the $N_2$ gas supplied into the process chamber 201 via the gas supply holes 420a of the nozzle 420 is controlled by the MFC 522 to range from 1 slm to 30 slm, preferably range from 1 slm to 20 slm, and more preferably range from 1 slm to 10 slm. When the flow rate of the $N_2$ gas is 30 slm or less, a reaction rate of the TMA gas may be improved. When the flow rate of the $N_2$ gas is 1 slm or more, removing the residual gas to be described below may be preferably performed.

A time duration of supplying the TMA gas to the wafers 200 (a time duration of supplying the TMA gas into the process chamber 201 via the gas supply holes 420a), i.e., a gas supply duration (a gas emission time), ranges, for example, from 1 to 60 seconds, preferably ranges from 1 to 30 seconds, and more preferably ranges from 3 to 5 seconds. When the gas supply duration is 60 seconds or less, the TMA gas is suppressed from being pyrolyzed and a methyl group or the like is suppressed from penetrating a film. When the gas supply duration is 1 second or more, a film-forming rate may be improved. Furthermore, the TMA gas supplied into the process chamber 201 via the gas supply holes 420a of the nozzle 420 passes through the nozzle 420 provided in a uniform temperature region and is thus pyrolyzed to be easily consumed in the nozzle 420. Thus, the time duration of supplying the TMA gas into the process chamber 201 via the gas supply holes 420a is preferably short. For example, the time duration of supplying the TMA gas into the process chamber 201 via the gas supply holes 420a is shorter than that of supplying the TMA gas into the process chamber 201 via the gas supply hole 410a of the nozzle 410.

In this case, the TMA gas and the inert gas ($N_2$ gas) only flow in the process chamber 201. When the TMA gas is supplied, for example, an Al-containing layer having a thickness of about less than one atomic layer to several atomic layers is formed on the wafers 200 accommodated on the bottom and middle of the boat 217.

[Removal of Residual Gas (S206)]

After the Al-containing layer is formed on the wafers 200 accommodated on the bottom and middle of the boat 217, the valve 324 is closed to stop the supplying of the TMA gas via the gas supply holes 420a of the nozzle 420. By removing a residual gas as described above, the TMA gas (that did not react or that has contributed to the formation of the Al-containing layer) remaining in the process chamber 201 is removed from the inside of the process chamber 201.

[Supply of Reactive Gas (S207)]

After the residual gas is removed from the inside of the process chamber 201, the valve 334 is opened to supply $O_3$ gas as a reactive gas into the gas supply pipe 330. A flow rate of the $O_3$ gas flowing in the gas supply pipe 330 is controlled by the MFC 332. The $O_3$ gas with the flow rate thereof adjusted is supplied into the process chamber 201 via the gas supply holes 430a of the nozzle 430. The $O_3$ gas supplied into the process chamber 201 is exhausted via the exhaust pipe 231. Through the above process, the $O_3$ gas is supplied onto the wafers 200. That is, surfaces of the wafers 200 are exposed to the $O_3$ gas. In this case, an inert gas is supplied into the gas supply pipe 530 by opening the valve 534. A flow rate of the inert gas flowing in the gas supply pipe 530 is controlled by the MFC 532. The inert gas is supplied into the process chamber 201 together with the $O_3$ gas and is exhausted via the exhaust pipe 231. In order to prevent the $O_3$ gas from flowing into the nozzles 410 and 420, the valves 514 and 524 are opened to supply the inert gas into the gas supply pipes 510 and 520. The inert gas is supplied into the process chamber 201 via the gas supply pipes 310 and 320 and the nozzles 410 and 420, and is exhausted via the exhaust pipe 231.

When the $O_3$ gas is supplied, the APC valve 243 is appropriately controlled to adjust the internal pressure of the process chamber 201 to range, for example, from 1 Pa to 1000 Pa, preferably range from 1 Pa to 100 Pa, and more preferably range from 10 Pa to 40 Pa. When the internal pressure of the process chamber 201 is 1000 Pa or less, removing a residual gas to be described below may be preferably performed. When the internal pressure of the process chamber 201 is 1 Pa or more, a sufficient film-forming rate may be achieved.

The flow rate of the $O_3$ gas supplied into the process chamber 201 via the gas supply holes 430a of the nozzle 430 is controlled by the MFC 332 to range, for example, from 5 slm to 40 slm, preferably range from 5 slm to 30 slm, and more preferably range from 10 slm to 20 slm. The flow rate of the $O_3$ gas is preferably increased to suppress impurities generated from the source gas from penetrating an aluminum oxide film. When the flow rate of the $O_3$ gas is 40 slm or less, removing the residual gas to be described below may be preferably performed. When the flow rate of the $O_3$ gas is 5 slm or more, a sufficient amount of the $O_3$ gas is supplied onto surfaces of the wafers 200.

A time duration of supplying the $O_3$ gas to the wafers 200 (a time duration of supplying the $O_3$ gas into the process chamber 201 via the gas supply holes 430a), i.e., a gas supply duration (a gas emission time), ranges, for example from 1 to 60 seconds, preferably ranges from 1 to 30 seconds, and more preferably ranges from 3 to 5 seconds. The time duration of supplying the $O_3$ gas to the wafers 200 is preferably increased to suppress impurities generated from the source gas from penetrating a film. Furthermore, when the time duration is 60 seconds or less, the throughput may be improved. When the time duration is 1 second or more, a film-forming rate may be improved.

In this case, the $O_3$ gas and the inert gas ($N_2$ gas) are only supplied into the process chamber 201. The $O_3$ gas is substituted and reacted with at least a portion of the Al-containing layer formed on the wafers 200 during the supplying of the source gas. When the substitution reaction occurs, Al contained in the Al-containing layer and oxygen (O) contained in the $O_3$ gas are combined to form an aluminum oxide layer (which is a metal oxide film containing Al and O) on the wafers 200.

[Removal of Residual Gas (S208)]

After the aluminum oxide layer is formed, the valve 334 is closed to stop the supplying of the $O_3$ gas. In this case, with the APC valve 243 of the exhaust pipe 231 open, the inside of the process chamber 201 is vacuum-exhausted by the vacuum pump 246 to remove the $O_3$ gas (that did not react or that has contributed to the formation of the aluminum oxide layer) or byproducts remaining in the process chamber 201 from the inside of the process chamber 201. An inert gas is supplied into the process chamber 201 in a state in which the valves 514, 524 and 534 are open. The inert gas acts as a purge gas. An effect of removing the $O_3$ gas (that did not react or that has contributed to the formation of the aluminum oxide layer) or the byproducts remaining in the process chamber 201 from the process chamber 201 may be improved by the inert gas. The inert gas may be supplied continuously or discontinuously (in the pulsation manner) while the Removal of the residual gas is performed using the valves 514, 524 and 534.

In this case, similar to the Removal of the residual gas after the source gas is supplied, a gas remaining in the process chamber 201 may not be completely removed and the inside of the process chamber 201 may not be completely purged.

[Performing Cycle Predetermined a Number of Times (S209)]

An aluminum oxide film is formed on the wafers 200 to a predetermined thickness by performing one or more times (a predetermined number of times) a cycle in which the supplying of the source gas (S203) (the first process), the Removal of the residual gas (S204), the supplying of the source gas (S205) (the second process), the Removal of the residual gas (S206), the supplying of the reactive gas (S207) and the Removal of the residual gas (S208) are sequentially performed. The number of times of performing the cycle in which the above processes are sequentially performed is appropriately selected according to the thickness of the aluminum oxide film to be finally formed, but this cycle is preferably repeatedly performed a plurality of times. The thickness of the aluminum oxide film ranges, for example, from 10 to 150 nm, preferably ranges from 40 to 100 nm, and more preferably ranges from 60 to 80 nm. When the thickness of the aluminum oxide film (film thickness) is 150 nm or less, a degree of surface roughness may be low. When the thickness of the aluminum oxide film (film thickness) is 10 nm or more, delamination of a film caused by the difference in stress between the film and a base film may be suppressed.

[Purging and Atmospheric Pressure Recovery (S210)]

By opening the valves 514, 524 and 534, an inert gas ($N_2$ gas) is supplied into the process chamber 201 via the gas supply pipes 510, 520 and 530 and is exhausted via the exhaust pipe 231. The inert gas acts as a purge gas and causes the inside of the process chamber 201 to be purged. A gas or byproducts remaining in the process chamber 201 are removed from the inside of the process chamber 201 (purging). Thereafter, an internal atmosphere of the process chamber 201 is substituted with the inert gas (substitution with the inert gas), and the internal pressure of the process chamber 201 is recovered to normal pressure (atmospheric pressure recovery).

[Boat Unloading and Wafer Discharging (S211)]

Thereafter, the seal cap 219 is moved down by the boat elevator 115 to open a lower end of the manifold 209. The processed wafers 200 (the wafers 200 having the aluminum oxide layer thereon) are unloaded from the lower end of the manifold 209 to the outside of the outer tube 203 while being supported in the boat 217 (boat unloading). The processed wafers 200 are discharged out of the boat 217 (wafer discharging).

A tank for storing an inert gas (inert gas storing unit) (not shown) may be further installed at the gas supply pipe 510. When the TMA gas is supplied into the gas supply pipe 310, the inert gas stored in the tank may be supplied into the gas supply pipe 510 and the TMA gas may be thus injected to the upper region of the process chamber 201. FIG. 10I is a diagram illustrating a detail example of the supplying of the source gas (S203), included in the method of manufacturing a semiconductor device according to the first embodiment of the present invention. The supplying of the source gas (S203) which is the first process may include storing an inert gas in the inert gas storing unit (S203-1), and injecting the TMA gas to the upper region of the process chamber 201 using the inert gas stored in the inert gas storing unit (S203-2).

According to the present embodiment, a tank for storing TMA gas (source gas storage unit) (not shown) may be further installed at an upstream end of the gas supply pipe 310. The tank stores the TMA gas and supplies the TMA gas into the process chamber 201 instantly. By supplying the TMA gas instantly, the source gas may be preferably supplied from the middle region of the process chamber 201 to the upper region thereof. The supplying of the source gas (S203) which is the first process may further include storing the source gas (TMA gas) in the source gas storage unit.

In respective processes 5203 and 5205 of the formation of the metal oxide film (S301A), the TMA gas (source gas) is supplied into the process chamber 201 via the gas supply pipes 310 and 320 and the nozzles 410 and 420. Thus, the source gas may be easily supplied to a desired region of the process chamber 201.

In the formation of the metal oxide film (S301A), the source gas is first supplied to the middle region and the upper region of the process chamber 201 (S203) and is then supplied to the lower region and the middle region of the process chamber 201 (S205). Thus, the source gas may be sufficiently supplied to the upper region. When the source gas is supplied to the upper region, the source gas diffuses and thus also flows in the lower region. Thus, insufficient supply of the source gas to the lower region due to thermal decomposition of the source gas in the nozzle 420 is suppressed. Accordingly, the source gas is sufficiently supplied to the lower region, thereby improving the uniformity of a film.

First Modified Example

Figure 10B:
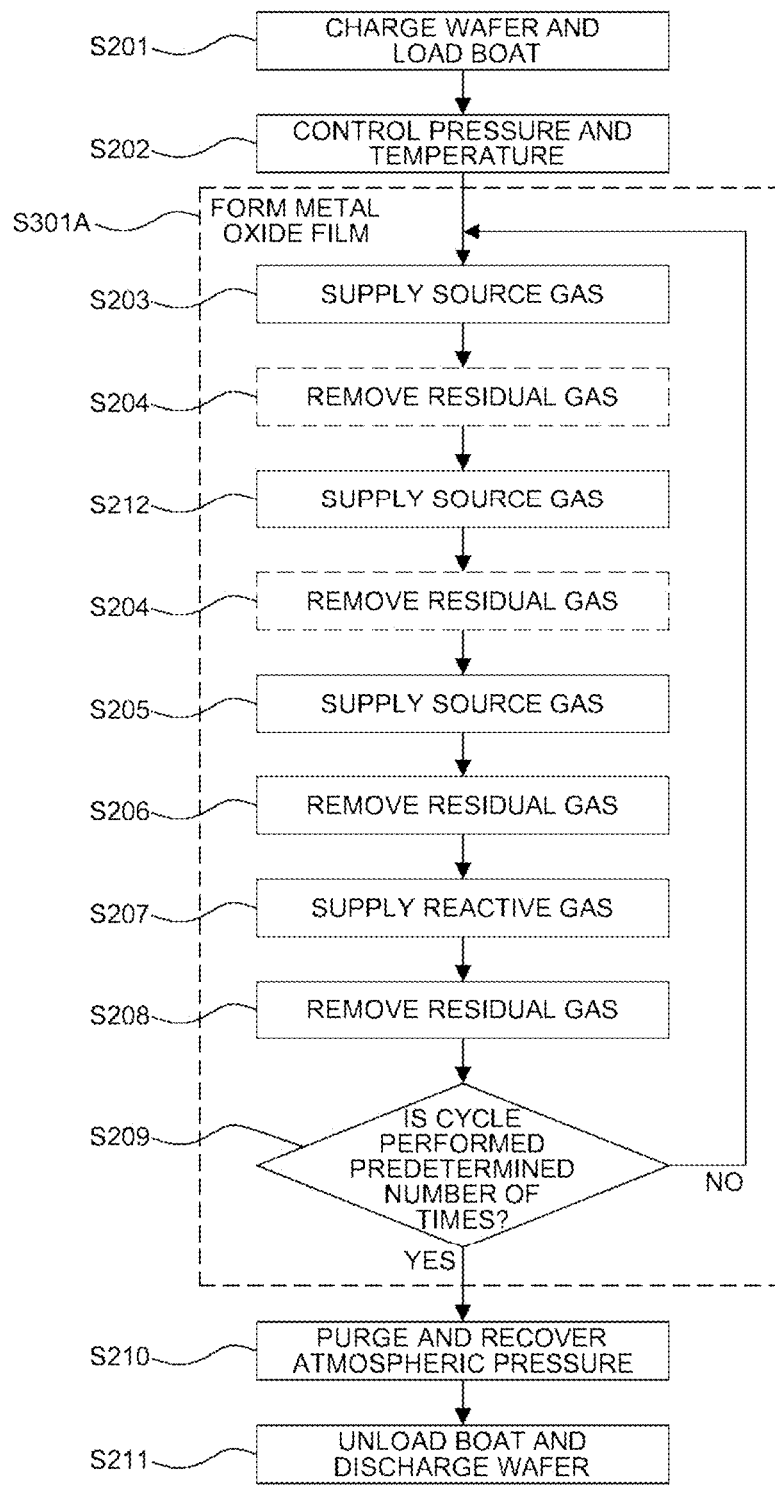

FIG. 10B is a flowchart of a first modified example of the method of manufacturing a semiconductor device according to the first embodiment of the present invention. Parts of the method of manufacturing a semiconductor device according to the first modified example that are the same as those of the method of manufacturing a semiconductor device according to the first embodiment of the present invention will not be described again here. According to the first modified example of the first embodiment, supplying the source gas (S212) in which the sum of the flow rates of the TMA gas and $N_2$ gas to be supplied via the gas supply hole 410a of the nozzle 410 is adjusted and the TMA gas is controlled to be supplied via the gas supply hole 410a of the nozzle 410 mainly from the lower region of the process chamber 201 to the middle region thereof is performed between supplying the source gas (S203) and supplying the source gas (S205). For example, in the supplying of the source gas (S203), the TMA gas (source gas) may be supplied via the gas supply hole 410a of the nozzle 410 according to first process conditions. In the supplying of the source gas (S212), the TMA gas (source gas) may be supplied via the gas supply hole 410a of the nozzle 410 according to second process conditions which are different from the first process conditions. The first and second process conditions may include flow rates of an inert gas to be supplied via the gas supply hole 410a of the nozzle 410, time durations of supplying the inert gas, flow rates of TMA gas, time durations of supplying the TMA gas, etc.

The first and second process conditions may include $N_2$ gas (inert gas) flow rates. The first $N_2$ gas flow rate (first inert gas flow rate) according to the first process conditions is preferably higher than the second $N_2$ gas flow rate (second inert gas flow rate) according to the second process conditions. The TMA gas may be supplied to the upper region of the process chamber 201 by supplying the inert gas via the gas supply hole 410a of the nozzle 410 at the first inert gas flow rate which is higher than the second inert gas flow rate. For example, the flow rate of the TMA gas may be the same as the first TMA gas flow rate by adjusting the flow rate of the inert gas to the first inert gas flow rate according to the first process conditions. The flow rate of the TMA gas may be the same as the second TMA gas flow rate which is lower than the first TMA gas flow rate by adjusting the flow rate of the inert gas to the second inert gas flow rate which is lower than the first inert gas flow rate according to the second process conditions.

The first and second process conditions may include TMA gas (source gas) flow rates. The first TMA gas flow rate (first source gas flow rate) according to the first process conditions is preferably higher than the second TMA gas flow rate (second source gas flow rate) according to the second process conditions. The TMA gas may be supplied to the upper region of the process chamber 201 by supplying the TMA gas via the gas supply hole 410a of the nozzle 410 at the first source gas flow rate which is higher than the second source gas flow rate.

In detail, in the supplying of the source gas (S212), the flow rate of $N_2$ gas supplied via the gas supply hole 410a of the nozzle 410 is lower than that in the supplying of the source gas (S203), and ranges, for example, from 1 slm to 30 slm, preferably ranges from 1 slm to 20 slm, and more preferably ranges from 1 slm to 10 slm. Other process conditions are the same as those of the supplying of the source gas (S203). Removing the residual gas (S204) performed after the supplying of the source gas (S203) may be performed between the supplying of the source gas (S203) and the supplying of the source gas (S212) or may not be performed. According to the first modified example, an aluminum oxide film may be formed on the wafers 200 in a manner which is the same as the manner in which the formation of the metal oxide film (S301A) described above is performed. The processes of the first modified example except the supplying of the source gas (S212) are the same as the formation of the metal oxide film (S301A) described above and are not thus described again here.

Second Modified Example

According to a second modified example of the first embodiment, supplying a source gas (S203) and supplying the source gas (S212) are performed in an order different from the order in which those according to the first modified example are performed. According to the second modified example, an aluminum oxide film may be formed on the wafers 200 in a manner which is the same as the manner in which the formation of the metal oxide film (S301A) described above is performed. Processes of the second modified example are the same as those of the first modified example described above and are not thus described again here.

Third Modified Example

Figure 10C:
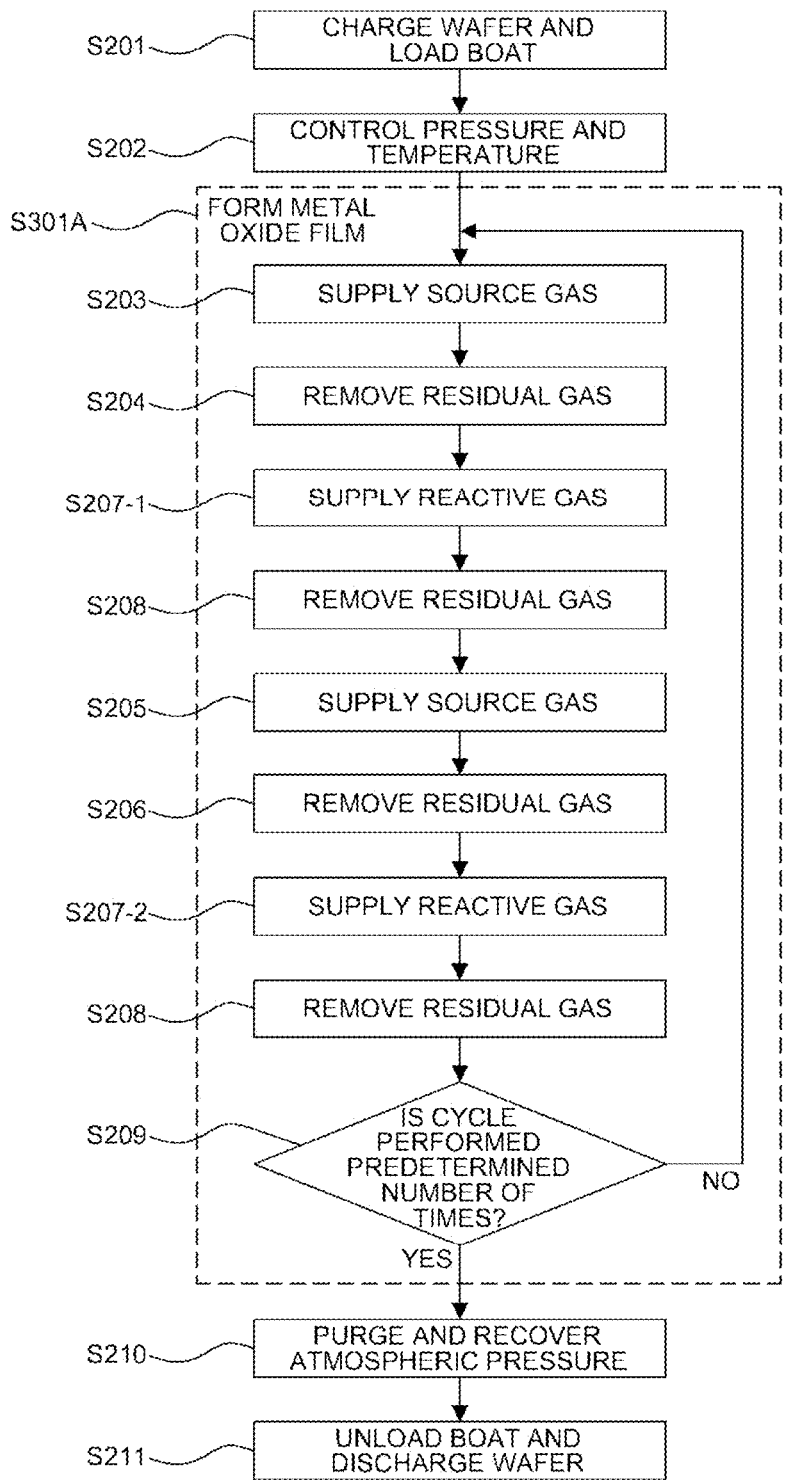

FIG. 10C is a flowchart of a third modified example of the method of manufacturing a semiconductor device according to the first embodiment of the present invention. Parts of the method of manufacturing a semiconductor device according to the third modified example that are the same as those of the method of manufacturing a semiconductor device according to the first embodiment of the present invention and those of the method of manufacturing a semiconductor device according to the first modified example will not be described again here. According to the third modified example of the first embodiment, supplying a source gas (S203), removing a residual gas (S204), supplying a reactive gas (S207-1), removing a residual gas (S208), supplying the source gas (S205), removing a residual gas (S206), and supplying the reactive gas (S207-2) are sequentially performed. According to the third modified example, whenever the source gas is supplied, the reactive gas is supplied. Thus, whenever an Al-containing layer is formed on the wafers 200, oxidation is performed due to the supplying of the source gas (S203) and the supplying of the source gas (S205). Thus, a high-quality film may be formed. Processes of the third modified example are the same as the formation of the metal oxide film (S301A) described above and are not thus described again here.

Fourth Modified Example

According to a fourth modified example of the first embodiment, a flow rate of $O_3$ gas supplied in supplying a reactive gas (S207-2) performed after supplying a source gas (S205) is higher than that of $O_3$ gas supplied in supplying the reactive gas (S207-1) performed after supplying the source gas (S203), compared to the third modified example. According to the fourth modified example, an Al-containing layer formed on the wafers 200 provided in the middle region and the upper region of the process chamber 201 in the supplying of the source gas (S203) may be suppressed from being over-oxidized in the supplying of the reactive gas (S207-1) performed after the supplying of the source gas (S203), thereby more uniformly oxidizing the Al-containing layer and forming a higher-quality film. Processes of the fourth modified example are the same as the formation of the metal oxide film (S301A) described above and are not thus described again here.

Fifth Modified Example

According to a fifth modified example of the first embodiment, a flow rate of a source gas supplied in supplying a source gas (S203) is higher than that of the source gas supplied in supplying the source gas (S205), and furthermore, a flow rate of $O_3$ gas supplied in supplying a reactive gas (S207-1) performed after the supplying of the source gas (S203) is higher than that of the $O_3$ gas supplied in supplying the reactive gas (S207-2) performed after the supplying of the source gas (S205), compared to the third modified example. According to the fifth modified example, in the supplying of the source gas (S203), an Al-containing layer is formed on the wafers 200 in the middle region and the upper region of the process chamber 201, and a small amount of an Al-containing layer is formed on the wafers 200 on the lower region and the middle region of the process chamber 201. After the above Al-containing layers are oxidized, the supplying of the source gas (S205) is performed to supply TMA gas to the wafers 200 provided in the lower region and the middle region of the process chamber 201 and having the Al-containing layer having a lower thickness so as to oxidize the Al-containing layer, thereby improving the uniformity of a film. Furthermore, processes of the fifth modified example are the same as the formation of the metal oxide film (S301A) described above and is thus not described again here.

Second Embodiment

Figure 10D:
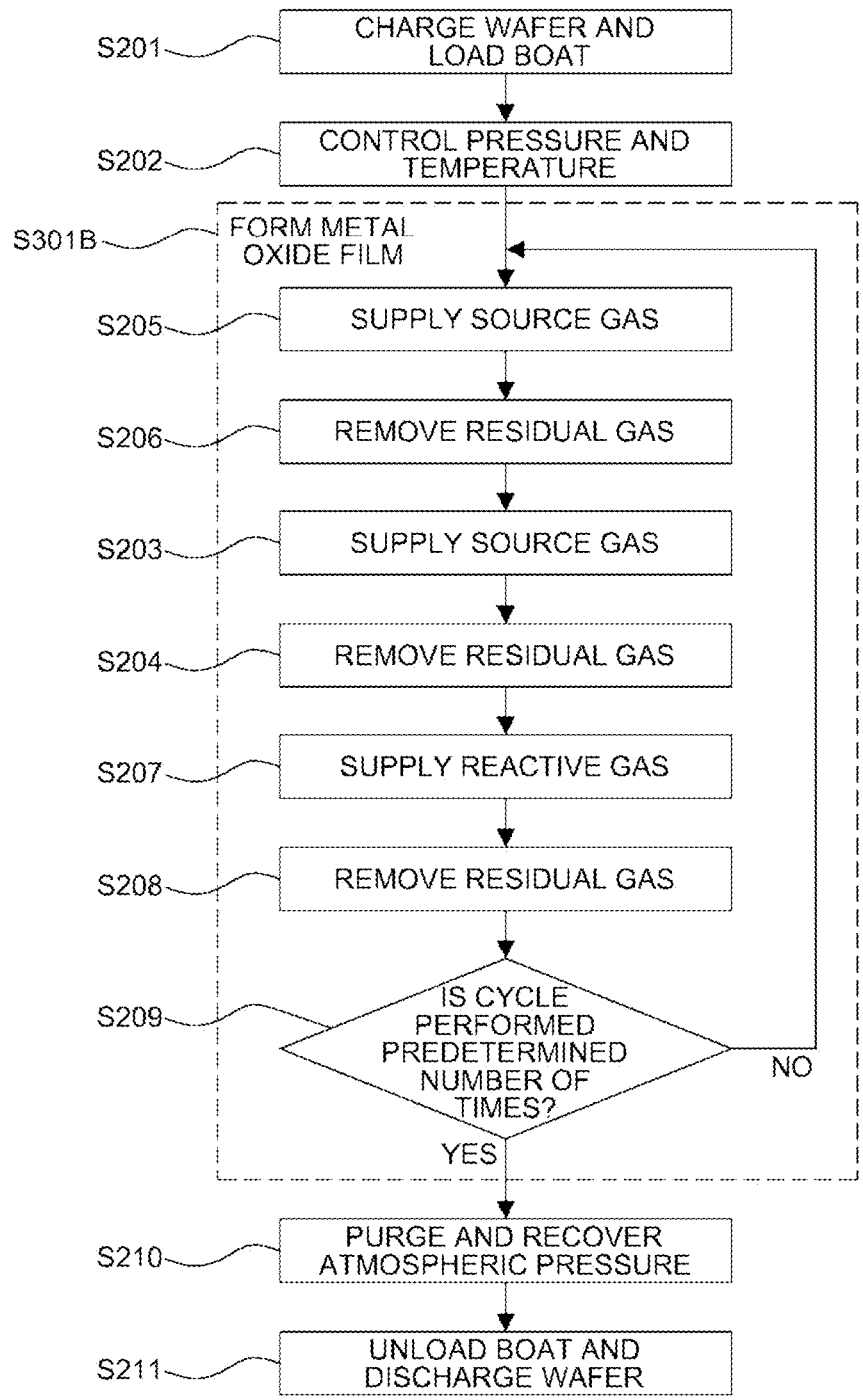

FIG. 10D is a flowchart of a method of manufacturing a semiconductor device according to a second embodiment of the present invention. Parts of the method of manufacturing a semiconductor device according to the second embodiment of the present invention that are the same as those of the method of manufacturing a semiconductor device according to the first embodiment of the present invention are not described again here.

[Formation of Metal Oxide Film (S301B)]

Next, formation of a metal oxide film (S301B), in which supplying a source gas (S205) (second process), removing a residual gas (S206), supplying the source gas (S203) (first process), removing a residual gas (S204), supplying a reactive gas (S207) (third process), and removing a residual gas (S208) are sequentially performed a predetermined number of times will be described below. The formation of the metal oxide film (S301B) according to the second embodiment is different from the formation of the metal oxide film (S301A) according to the first embodiment, in that the supplying of the source gas (S203) which is the first process and the supplying of the source gas (S205) which is the second process are performed in a different order. Similar to the formation of the metal oxide film (S301A), an aluminum oxide film may be formed on the wafers 200 in the formation of the metal oxide film (S301B). Processes of the formation of the metal oxide film (S301B) are the same as the formation of the metal oxide film (S301A) described above and are not thus described again here.

In the formation of the metal oxide film (S301B), the source gas is first supplied to the lower and middle regions of the process chamber 201 and is then supplied to the middle and upper regions of the process chamber 201. Thus, the source gas may be sufficiently supplied to the upper region of the process chamber 201. A shortage in the source gas supplied to the lower region due to thermal decomposition of the source gas in the nozzle 420 may be compensated for by diffusion of the source gas which is subsequently supplied to the upper region of the process chamber 201. Thus, the source gas may be sufficiently supplied to the lower region, thereby improving the uniformity of a film.

Third Embodiment

Figure 4:
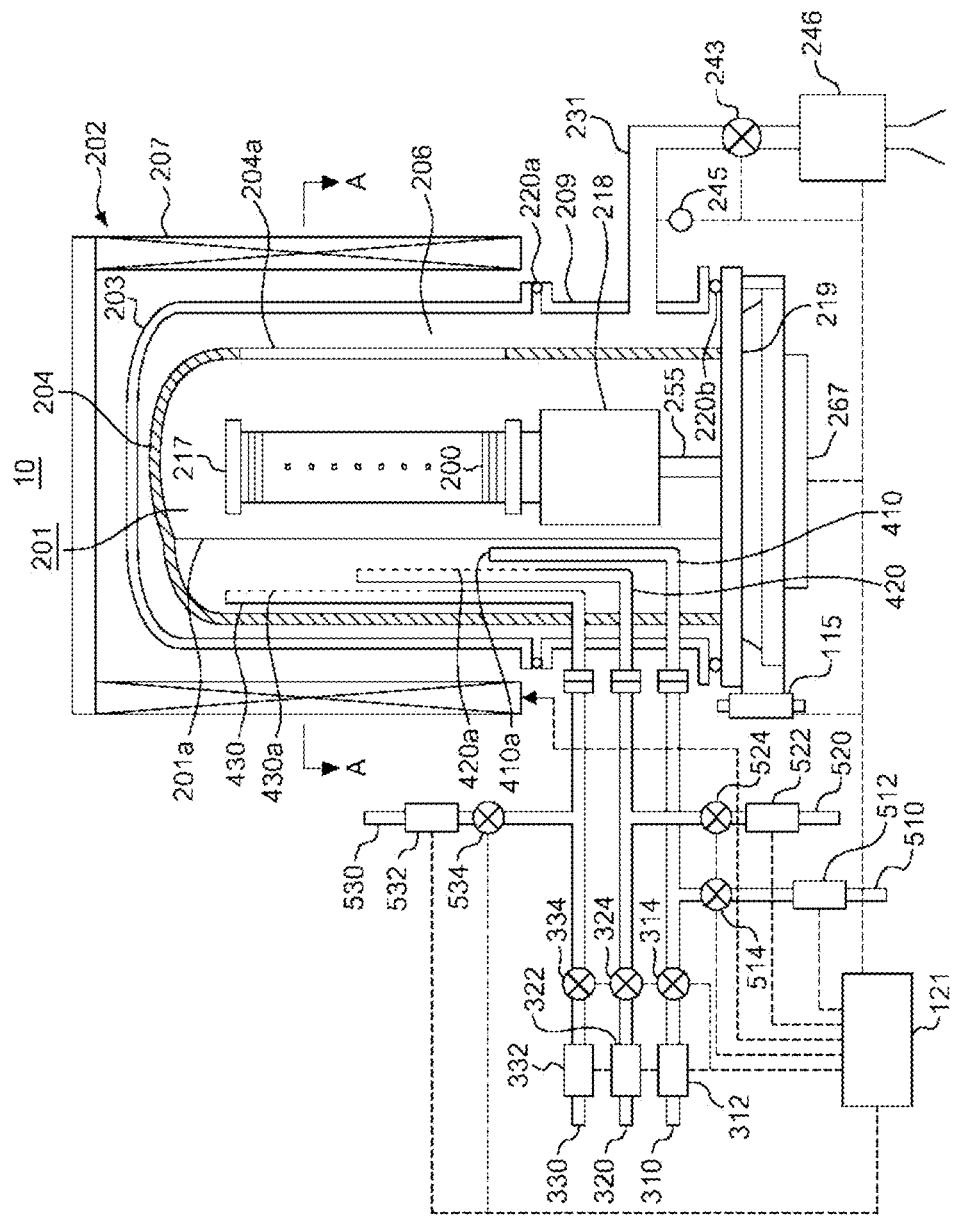
FIG. 4 is a diagram schematically illustrating a longitudinal section of a vertical process furnace of a substrate processing apparatus according to a third embodiment.

Next, a substrate processing apparatus 10 and formation of a metal oxide film (S301C) according to a third embodiment will be described below. As illustrated in FIG. 4, the substrate processing apparatus 10 according to the third embodiment is different from the substrate processing apparatus 10 according to the first embodiment in that a gas supply pipe 310 and a gas supply pipe 320 are independently installed without being included in a source gas supply system and an MFC 322 is installed at the gas supply pipe 320. That is, in the substrate processing apparatus 10 according to the first embodiment, a source gas sequentially passes through the gas supply pipes 310 and 320 and the nozzles 410 and 420 and is then supplied into the process chamber 201. In contrast, in the substrate processing apparatus 10 according to the present embodiment, a source gas may be supplied into a process chamber 201 sequentially via the gas supply pipes 310 and 320 and nozzles 410 and 420 or simultaneously via the gas supply pipes 310 and 320 and the nozzles 410 and 420. FIG. 10E is a flowchart of a method of manufacturing a semiconductor device according to the third embodiment of the present invention. Parts of the method of manufacturing a semiconductor device according to the third embodiment of the present invention that are the same as those of the method of manufacturing a semiconductor device according to the first embodiment of the present invention are not described again here.

[Formation of Metal Oxide Film (S301C)]

Next, formation of a metal oxide film (S301C) in which supplying a source gas (S213) in which a first process and a second process are simultaneously performed, removing a residual gas (S204), supplying a reactive gas (S207) (a third process), and removing a residual gas (S208) are sequentially performed a predetermined number of times will be described. In the formation of the metal oxide film (S301C), the supplying of the source gas (S203) (first process) and the supplying of the source gas (S205) (second process) according to the first embodiment are simultaneously performed to form a metal oxide film on wafers 200. The expression "simultaneously performing the first process and the second process" should be understood to mean that timing of performing the first process and timing of performing the second process overlap each other. Timing when the first process is started and timing when the second process is started may be the same or different, and timing when the first process is completed and timing when the second process is completed may be the same or different.

[Supplying of Source Gas (S213)]

First, valves 314 and 324 are opened to supply TMA gas into the gas supply pipes 310 and 320. A flow rate of the TMA gas flowing in the gas supply pipes 310 and 320 is adjusted by MFCs 312 and 322 to a third TMA gas flow rate (a third source gas flow rate). The TMA gas with the flow rate thereof adjusted is supplied into the process chamber 201 via a gas supply hole 410a of the nozzle 410 and a plurality of gas supply holes 420a of the nozzle 420 to be supplied onto the wafers 200. When the TMA gas is supplied into the gas supply pipes 310 and 320, valves 514 and 524 are opened to supply an inert gas such as $N_2$ gas into gas supply pipes 510 and 520. A flow rate of the inert gas flowing in the gas supply pipes 510 and 520 is adjusted by MFCs 512 and 522 to a third inert gas flow rate. The inert gas with the flow rate thereof adjusted is supplied into the process chamber 201 together with the TMA gas and is exhausted via an exhaust pipe 231.

In this case, the sum of the flow rates of the TMA gas and the inert gas is adjusted to supply the TMA gas to the lower and middle regions of the process chamber 201 via the plurality of gas supply holes 420a of the nozzle 420, and to supply the TMA gas to the middle and upper regions of the process chamber 201 via the gas supply hole 410a of the nozzle 410. The sum of the flow rates of the TMA gas and the inert gas may be adjusted by adjusting the flow rate of the TMA gas, the flow rate of the inert gas, or both of the flow rates of the TMA gas and the inert gas. In this case, in order to prevent the TMA gas from flowing into a nozzle 430, a valve 534 is opened to supply the inert gas into a gas supply pipe 530. The inert gas is supplied into the process chamber 201 via the gas supply pipe 330 and the nozzle 430 and is exhausted via the exhaust pipe 231.

In the formation of the metal oxide film (S301C), when the supplying of the source gas (S213) is performed, an internal pressure of the process chamber 201, the flow rates of the TMA gas and the inert gas supplied into the process chamber 201 via the gas supply hole 410a of the nozzle 410, the flow rates of the TMA gas and the inert gas supplied into the process chamber 201 via the gas supply holes 420a of the nozzle 420, time durations of supplying the TMA gas and the inert gas to the wafers 200, and internal temperature of the process chamber 201 are preferably the same as those of the supplying of the source gas (S203) and the supplying of the source gas (S205) (the first and second processes) in the formation of the metal oxide film (S301A) described above.

In the formation of the metal oxide film (S301C), the TMA gas (source gas) is supplied into the process chamber 201 simultaneously via the gas supply pipes 310 and 320 and the nozzles 410 and 420. Thus, the number of the processes of the formation of the metal oxide film (S301C) is less than that of the processes of the formation of the metal oxide film (S301A). Thus, a time needed to form the metal oxide film may decrease to improve the throughput.

Fourth Embodiment

Figure 5:
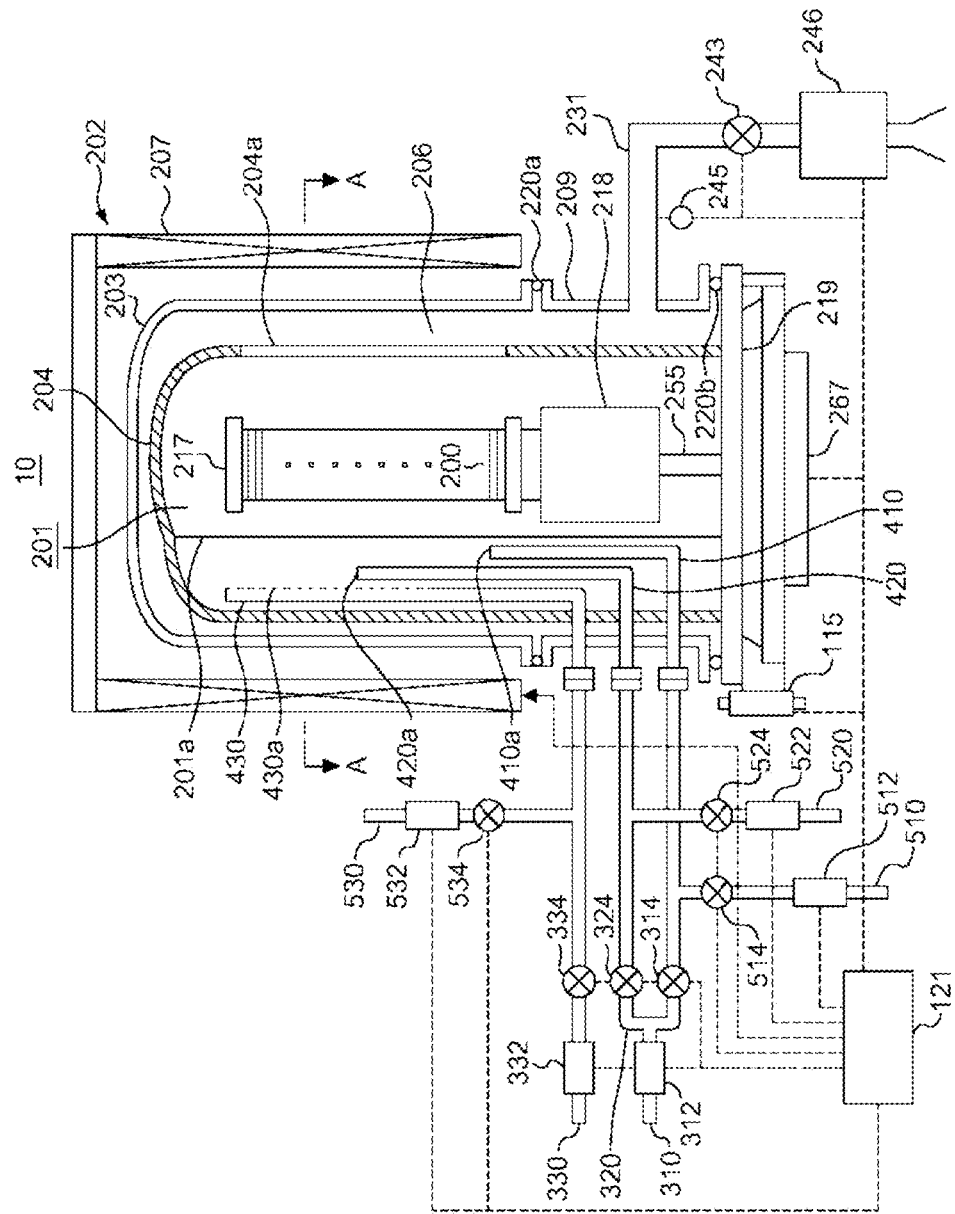
FIG. 5 is a diagram schematically illustrating a longitudinal section of a vertical process furnace of a substrate processing apparatus according to a fourth embodiment.
Figure 6:
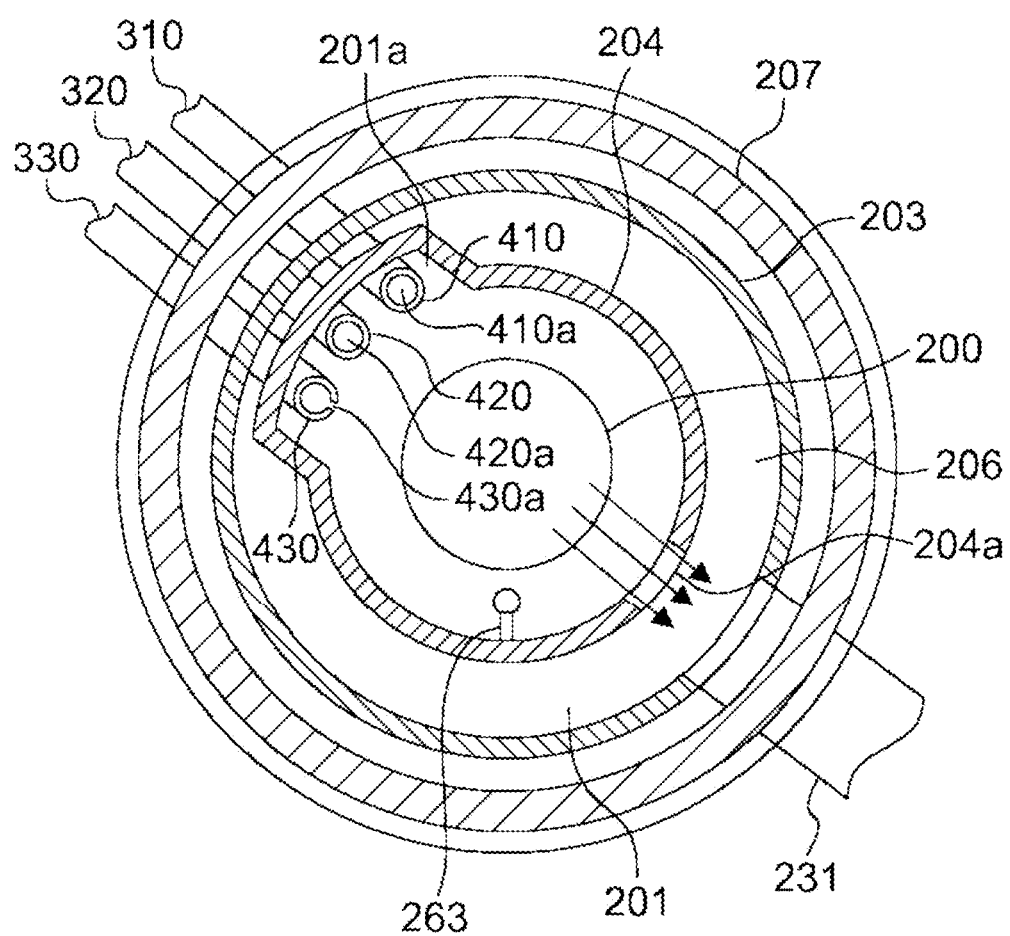
FIG. 6 is a schematic cross-sectional view taken along line A-A of FIG. 5.

Next, a substrate processing apparatus 10 and formation of a metal oxide film (S301D) according to a fourth embodiment will be described below. As illustrated in FIGS. 5 and 6, the substrate processing apparatus 10 according to the fourth embodiment is different from the substrate processing apparatus 10 according to the first embodiment, in that one gas supply hole 420a of a nozzle 420 is installed in a vertical direction, similar to a gas supply hole 410a of a nozzle 410.

According to the fourth embodiment, a source gas supplied upward toward an upper region of a process chamber 201 via the gas supply hole 410a of the nozzle 410 (first nozzle) is supplied mainly to a lower region and a middle region of the process chamber 201. Thus, the source gas is supplied mainly to wafers 200 accommodated on the bottom and middle of a boat 217. For example, the source gas may be supplied mainly to the lower and middle regions of the process chamber 201 by adjusting the sum of flow rates of gases supplied via the gas supply hole 410a of the nozzle 410. In this case, the sum of flow rates of gases supplied via the gas supply hole 410a of the nozzle 410 may be adjusted by adjusting a flow rate of an inert gas supplied via the gas supply hole 410a of the nozzle 410, a flow rate of the source gas supplied via the gas supply hole 410a of the nozzle 410, or both of the flow rates of the inert gas and the source gas supplied via the gas supply hole 410a of the nozzle 410. Thus, the source gas is sufficiently supplied onto even the wafers 200 on the bottom of the boat 217. Since the sufficient amount of the source gas is supplied, the uniformity of a film to be formed on the wafers 200 may be improved.

Figure 10F:
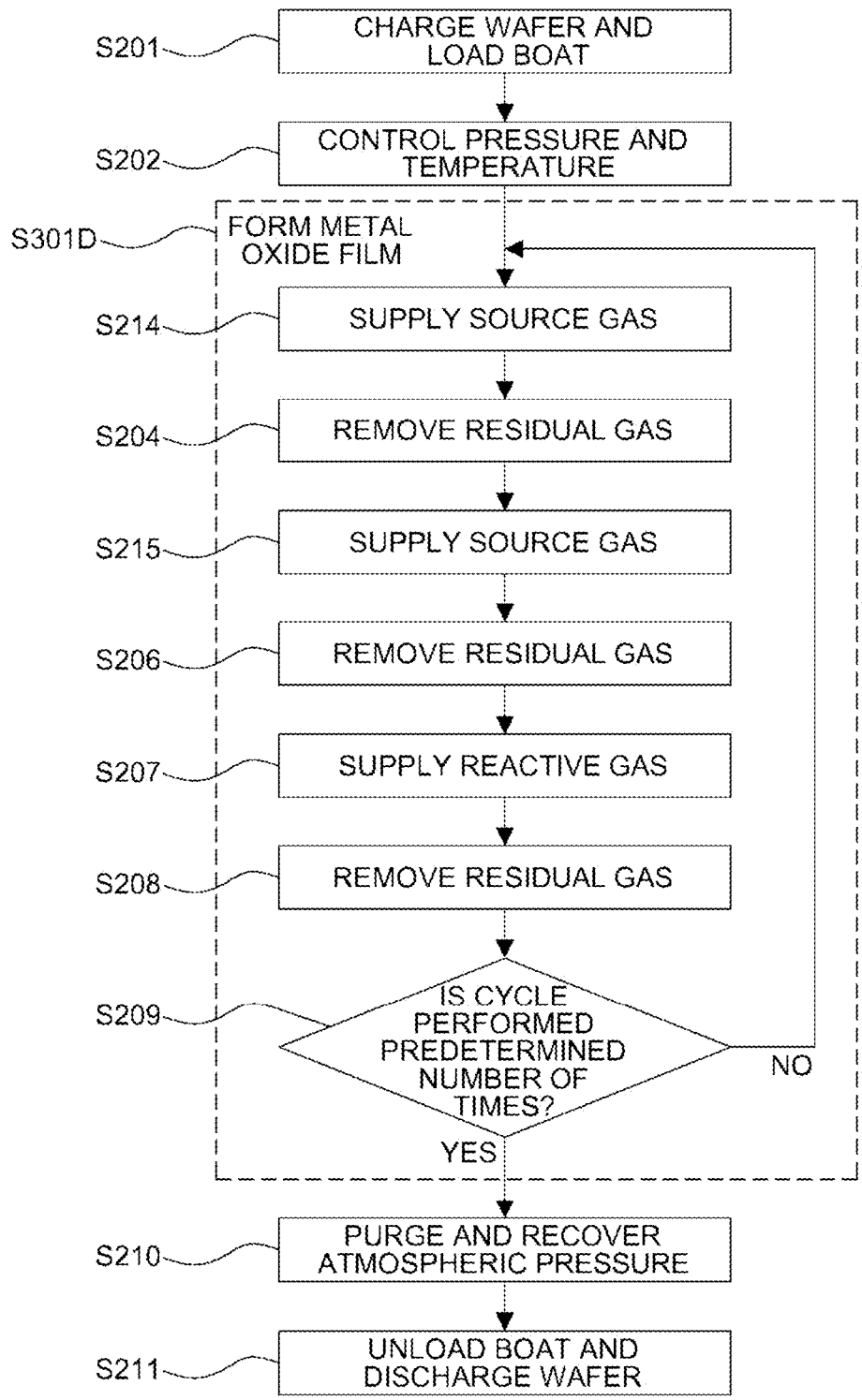

Since the source gas supplied upward via the gas supply hole 420a of the nozzle 420 (second nozzle) is supplied mainly to the middle and upper regions of the process chamber 201, the source gas is supplied mainly to the wafers 200 on the middle and top of the boat 217. The sum of flow rates of gases supplied via the gas supply hole 420a of the nozzle 420 may be the same as the sum of the flow rates of the gases supplied via the gas supply hole 410a of the nozzle 410. The gas supply hole 420a is vertically provided in the nozzle 420 extending from the lower region of the process chamber 201 to middles regions of the wafers 200 accommodated in the process chamber 201. Thus, even when the sum of the flow rates of the gases supplied via the gas supply hole 420a of the nozzle 420 is the same as the sum of the flow rates of the gases supplied via the gas supply hole 410a of the nozzle 410, the source gas may be supplied mainly to the middle region and the upper region of the process chamber 201. The sum of the flow rates of the gases supplied via the gas supply hole 420a of the nozzle 420 may be the same as the sum of the flow rates of the gases supplied via the gas supply hole 410a of the nozzle 410. When the sum of the flow rates of the gases supplied via the gas supply hole 420a of the nozzle 420 is the same as the sum of the flow rates of the gases supplied via the gas supply hole 410a of the nozzle 410, the source gas may be sufficiently supplied onto even the wafers 200 on the top (top region) of the boat 217. Since the sufficient amount of the source gas is supplied, the uniformity of a film to be formed on the wafers 200 may be improved. FIG. 10F is a flowchart of a method of manufacturing a semiconductor device according to the fourth embodiment of the present invention. Parts of the method of manufacturing a semiconductor device according to the fourth embodiment of the present invention that are the same as those of the method of manufacturing a semiconductor device according to the first embodiment of the present invention are not described again here.

[Formation of Metal Oxide Film (S301D)]

Next, formation of a metal oxide film (S301D) will be described. In the formation of the metal oxide film (S301D), supplying the source gas (S214) in which the source gas is supplied upward via the gas supply hole 420a of the nozzle 420, removing a residual gas (S204), supplying the source gas (S215) in which the source gas is supplied upward via the gas supply hole 410a of the nozzle 410, removing a residual gas (S206), supplying a reactive gas (S207) in which the reactive gas is supplied onto the wafers 200 via a plurality of gas supply holes 430a of a nozzle 430, and removing a residual gas (S208) are sequentially performed a predetermined number of times. Processes of the formation of the metal oxide film (S301D) that are the same as those of the formation of the metal oxide film (S301A) are not described again here.

[Supplying Source Gas (S214)]

First, a valve 324 is opened to supply TMA gas into a gas supply pipe 320. A flow rate of the TMA gas flowing in the gas supply pipe 320 is adjusted by an MFC 312 to a fourth TMA gas flow rate (a fourth source gas flow rate). The TMA gas with the flow rate thereof adjusted is supplied upward toward the upper region of the process chamber 201 via the gas supply hole 420a of the nozzle 420 and is exhausted via an exhaust pipe 231. The TMA gas is supplied onto the wafers 200. That is, surfaces of the wafers 200 are exposed to the TMA gas. When the TMA gas is supplied into the gas supply pipe 320, a valve 524 is opened to supply an inert gas such as $N_2$ gas into a gas supply pipe 520. A flow rate of the inert gas flowing in the gas supply pipe 520 is adjusted by an MFC 522 to a fourth inert gas flow rate (a fourth inert gas flow rate). The inert gas with the flow rate thereof adjusted is supplied into the process chamber 201 together with the TMA gas, and is exhausted via the exhaust pipe 231. In this case, in order to prevent the TMA gas from flowing into the nozzles 410 and 430, valves 514 and 534 are opened to supply the inert gas into gas supply pipes 510 and 530. The inert gas is supplied into the process chamber 201 via gas supply pipes 310 and 330 and the nozzles 410 and 430, and is exhausted via the exhaust pipe 231.

In the formation of the metal oxide film (S301D), when the supplying of the source gas (S214) is performed, an internal pressure of the process chamber 201, a time duration of supplying the TMA gas to the wafers 200 and internal temperature of the process chamber 201 are preferably the same as those of the supplying of the source gas (S203) which is the first process included in the formation of the metal oxide film (S301A) described above.

A flow rate of the TMA gas supplied upward via the gas supply hole 420a of the nozzle 420 is controlled by the MFC 312 to range, for example, from 10 sccm to 500 sccm, preferably range from 50 sccm to 300 sccm, and more preferably range from 50 sccm to 150 sccm. When the flow rate of the TMA gas is 500 sccm or less, removing a residual gas to be described below may be preferably performed. When the flow rate of the TMA gas is 10 sccm or more, a reaction rate of the TMA gas on surfaces of the wafers 200 may be improved.

When the TMA gas is supplied into the process chamber 201 via the gas supply hole 420a of the nozzle 420, a flow rate of $N_2$ gas supplied into the process chamber 201 via the gas supply hole 420a of the nozzle 420 is controlled by the MFC 522 to range, for example, from 1 slm to 30 slm, preferably range from 1 slm to 20 slm, and more preferably range from 1 slm to 10 slm. When the flow rate of the $N_2$ gas is 30 slm or less, a reaction rate of TMA gas may be improved. When the flow rate of the $N_2$ gas is 1 slm or more, the TMA gas supplied via the gas supply hole 420a of the nozzle 420 may be supplied above the middle region of the process chamber 201 and removing a residual gas to be described below may be preferably performed.

[Supplying Of Source Gas (S215)]

When a residual gas is removed from the inside of the process chamber 201 by performing the Removal of the residual gas (S204), a valve 314 is opened to supply TMA gas as a source gas into the gas supply pipe 310. A flow rate of the TMA gas flowing in the gas supply pipe 310 is controlled by the MFC 312 to a fifth TMA gas flow rate (a fifth source gas flow rate). The TMA gas with the flow rate thereof adjusted is supplied upward via the gas supply hole 410a of the nozzle 410 to be supplied onto the wafers 200. When the TMA gas is supplied into the gas supply pipe 310, the valve 514 is opened to supply an inert gas such as $N_2$ gas into the gas supply pipe 510. A flow rate of the inert gas flowing in the gas supply pipe 510 is controlled by an MFC 512 to a fifth inert gas flow rate (a fifth inert gas flow rate). The inert gas with the flow rate thereof adjusted is supplied into the process chamber 201 together with the TMA gas, and is exhausted via the exhaust pipe 231. In this case, in order to prevent the TMA gas from flowing into the nozzles 420 and 430, the valves 524 and 534 are opened to supply an inert gas into the gas supply pipes 520 and 530. The inert gas is supplied into the process chamber 201 via the gas supply pipes 320 and 330 and the nozzles 420 and 430, and is exhausted via the exhaust pipe 231.

In the formation of the metal oxide film (S301D), when the supplying of the source gas (S215) is performed, an internal pressure of the process chamber 201, a time duration of supplying the TMA gas to the wafers 200 and internal temperature of the process chamber 201 are preferably the same as those of the supplying of the source gas (S205) which is the second process of the formation of the metal oxide film (S301A) described above. A time duration of supplying the TMA gas via the gas supply hole 420a of the nozzle 420 may be shorter than that of supplying the TMA gas via the gas supply hole 410*a* of the nozzle 410. Since the nozzle 420 is longer than the nozzle 410 and extends in a uniform temperature region, the TMA gas is more easily decomposed in the nozzle 420 than in the nozzle 410. By decreasing a time duration of supplying the TMA gas via the gas supply hole 420*a* of the nozzle 420, a large amount of decomposed TMA gas may be suppressed from being supplied into the process chamber 201.

A flow rate of the TMA gas supplied upward via the gas supply hole 410*a* of the nozzle 410 is controlled by the MFC 312 to range, for example, from 10 sccm to 500 sccm, preferably range from 50 sccm to 300 sccm, and more preferably range from 50 sccm to 150 sccm. When the flow rate of the TMA gas supplied upward via the gas supply hole 410*a* of the nozzle 410 is 500 sccm or less, removing a residual gas to be described below may be preferably performed. When the flow rate of the TMA gas supplied upward via the gas supply hole 410*a* of the nozzle 410 is 10 sccm or more, the reaction rate of the TMA gas at surfaces of the wafers 200 may be improved.

When the TMA gas is supplied into the process chamber 201 via the gas supply hole 410*a* of the nozzle 410, a flow rate of $N_2$ gas supplied into the process chamber 201 via the gas supply hole 410*a* of the nozzle 410 is controlled by the MFC 512 to range from 1 slm to 30 slm, preferably range from 1 slm to 20 slm, and more preferably range from 1 slm to 10 slm. When the flow rate of the $N_2$ gas supplied into the process chamber 201 via the gas supply hole 410*a* of the nozzle 410 is 30 slm or less, a larger amount of the TMA gas may be supplied to the lower region of the process chamber 201 via the gas supply hole 410*a* of the nozzle 410, thereby increasing the reaction rate of the TMA gas. When the flow rate of the $N_2$ gas is 1 slm or more, removing a residual gas to be described below may be preferably performed.

In the formation of the metal oxide film (S301D), when the TMA gas is supplied upward via two nozzles, the lengths of which correspond to a target region, the TMA gas may be independently and sufficiently supplied to different target regions, thereby improving the uniformity of a film.

Fifth Embodiment

Figure 10G:
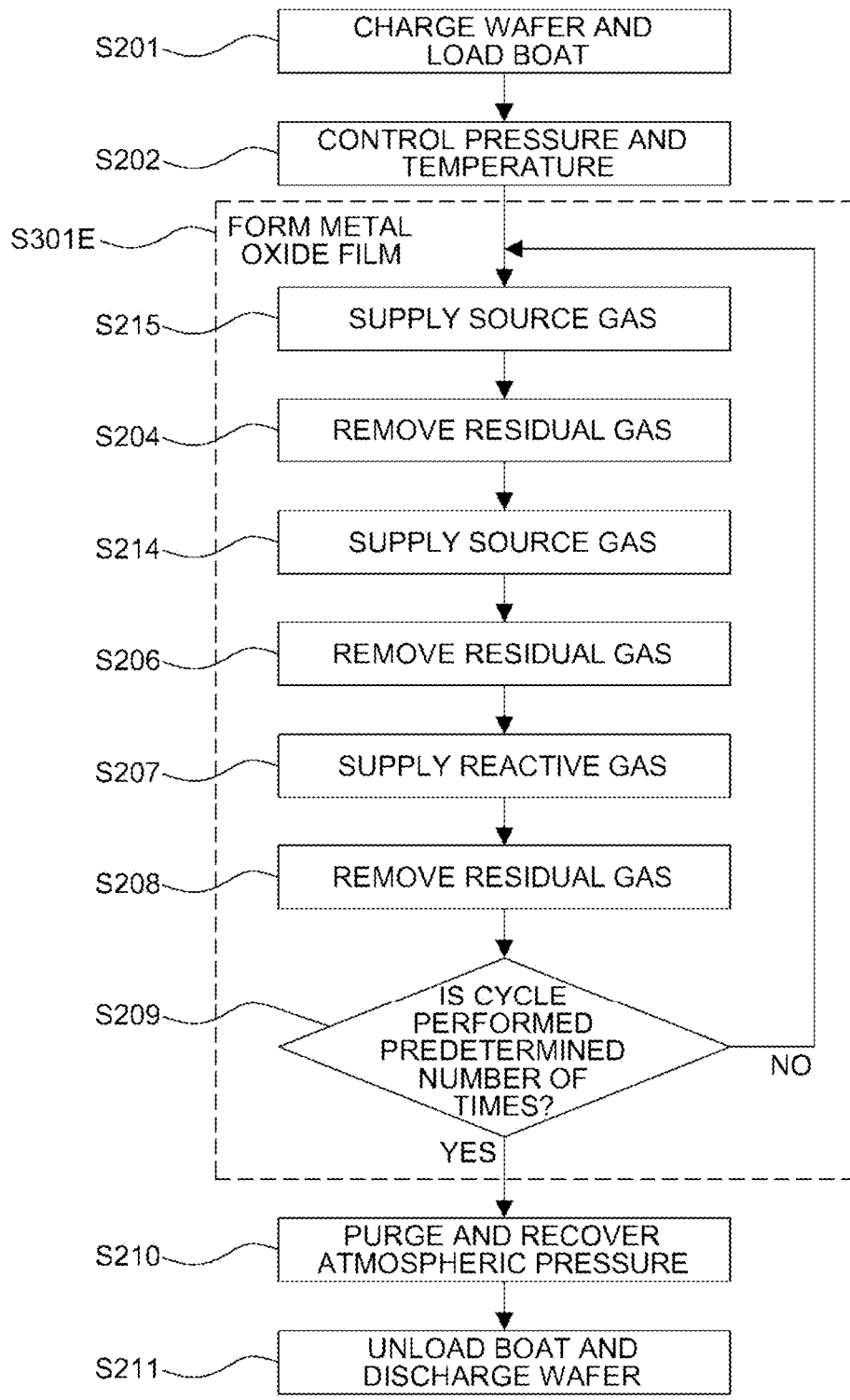

FIG. 10G is a flowchart of a method of manufacturing a semiconductor device according to a fifth embodiment of the present invention. Parts of the method of manufacturing a semiconductor device according to the fifth embodiment of the present invention that are the same as those of the method of manufacturing a semiconductor device according to the fourth embodiment are not described again here. The fifth embodiment includes formation of a metal oxide film (S301E), in which supplying a source gas (S215) in which the source gas is supplied upward via the gas supply hole 410*a* of the nozzle 410, removing a residual gas (S204), supplying the source gas (S214) in which the source gas is supplied upward via the gas supply hole 420*a* of the nozzle 420, removing a residual gas (S206), supplying a reactive gas (S207) in which a reactive gas is supplied onto the wafers 200 via the plurality of gas supply holes 430*a* of the nozzle 430, and removing a residual gas (S208) are sequentially performed a predetermined number of times. The formation of the metal oxide film (S301E) according to the fifth embodiment is different from the formation of the metal oxide film (S301D) in that the supplying of the source gas (S214) and the supplying of the source gas (S215) are performed in a different order.

Sixth Embodiment

Figure 7:
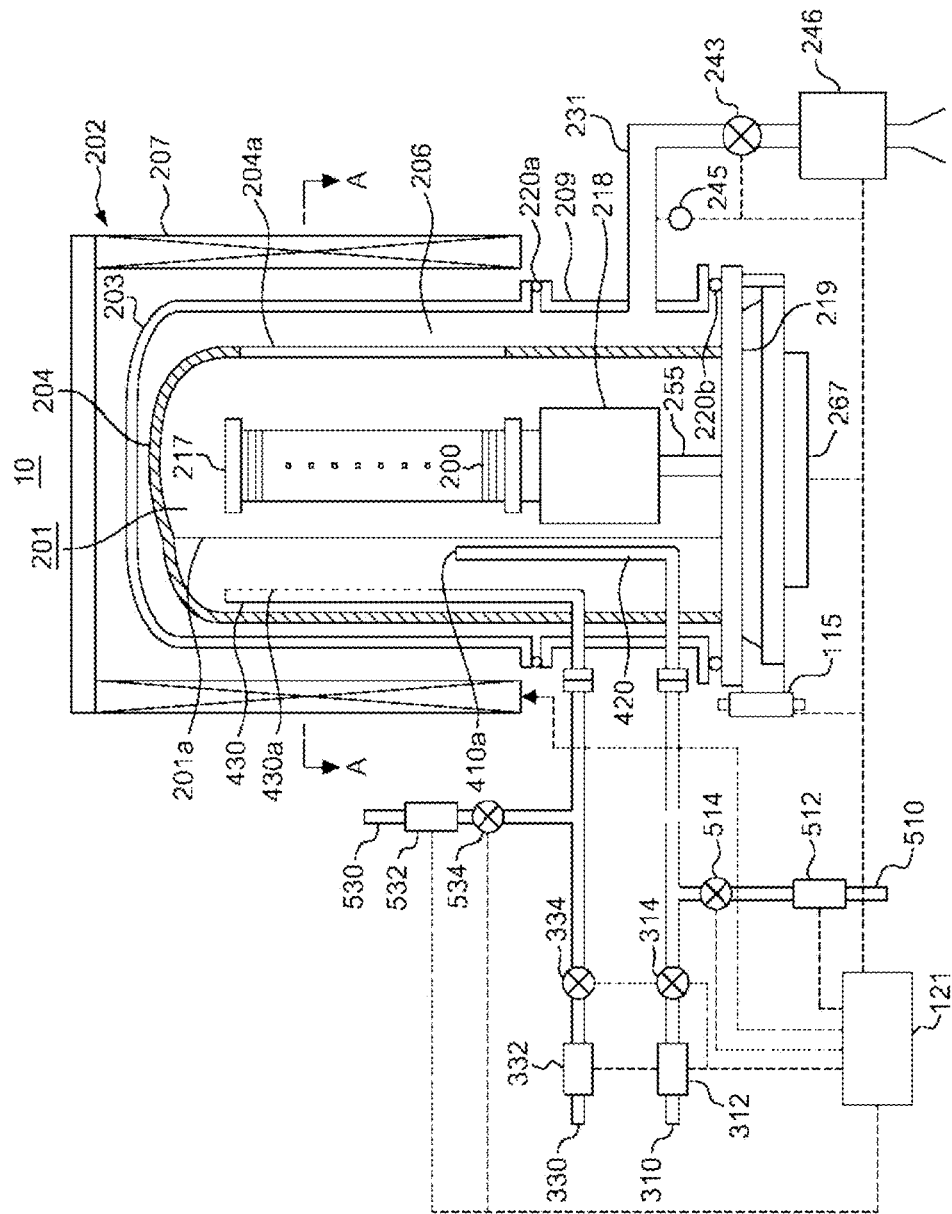
FIG. 7 is a diagram schematically illustrating a longitudinal section of a vertical process furnace of a substrate processing apparatus according to a sixth embodiment.
Figure 8:
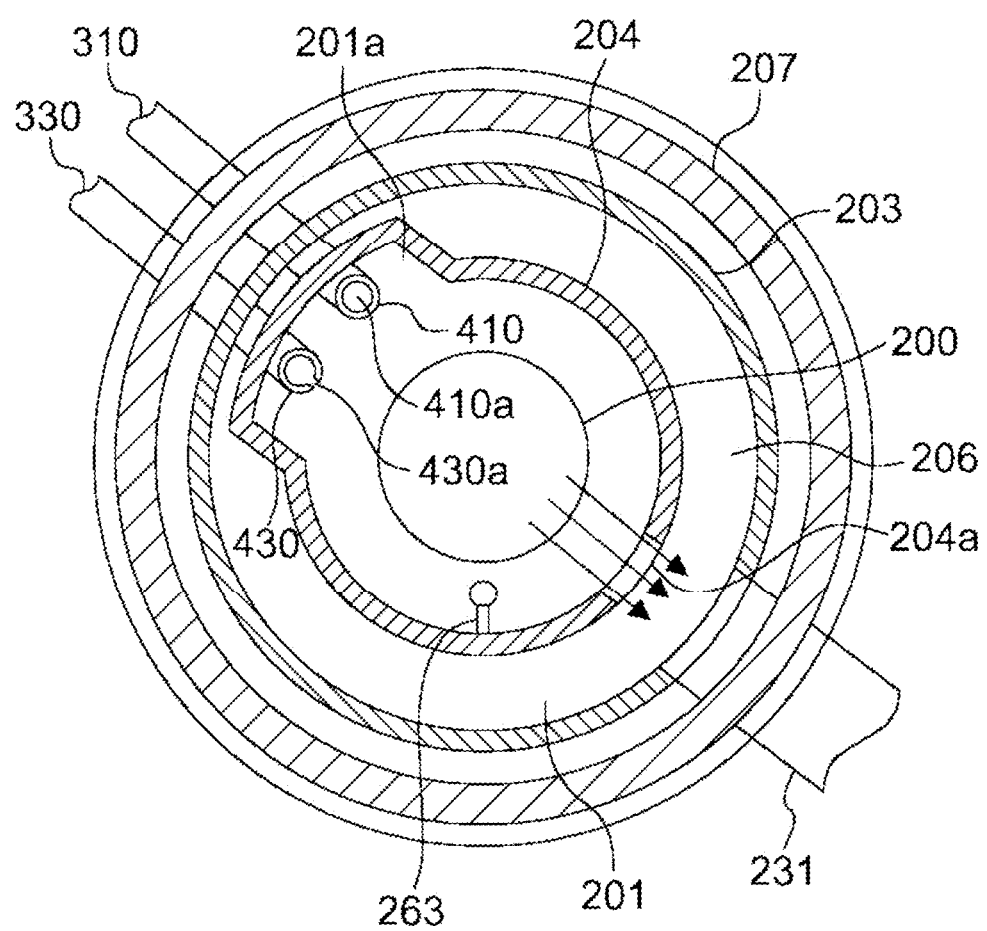
FIG. 8 is a schematic cross-sectional view taken along line A-A of FIG. 7.
Figure 10H:
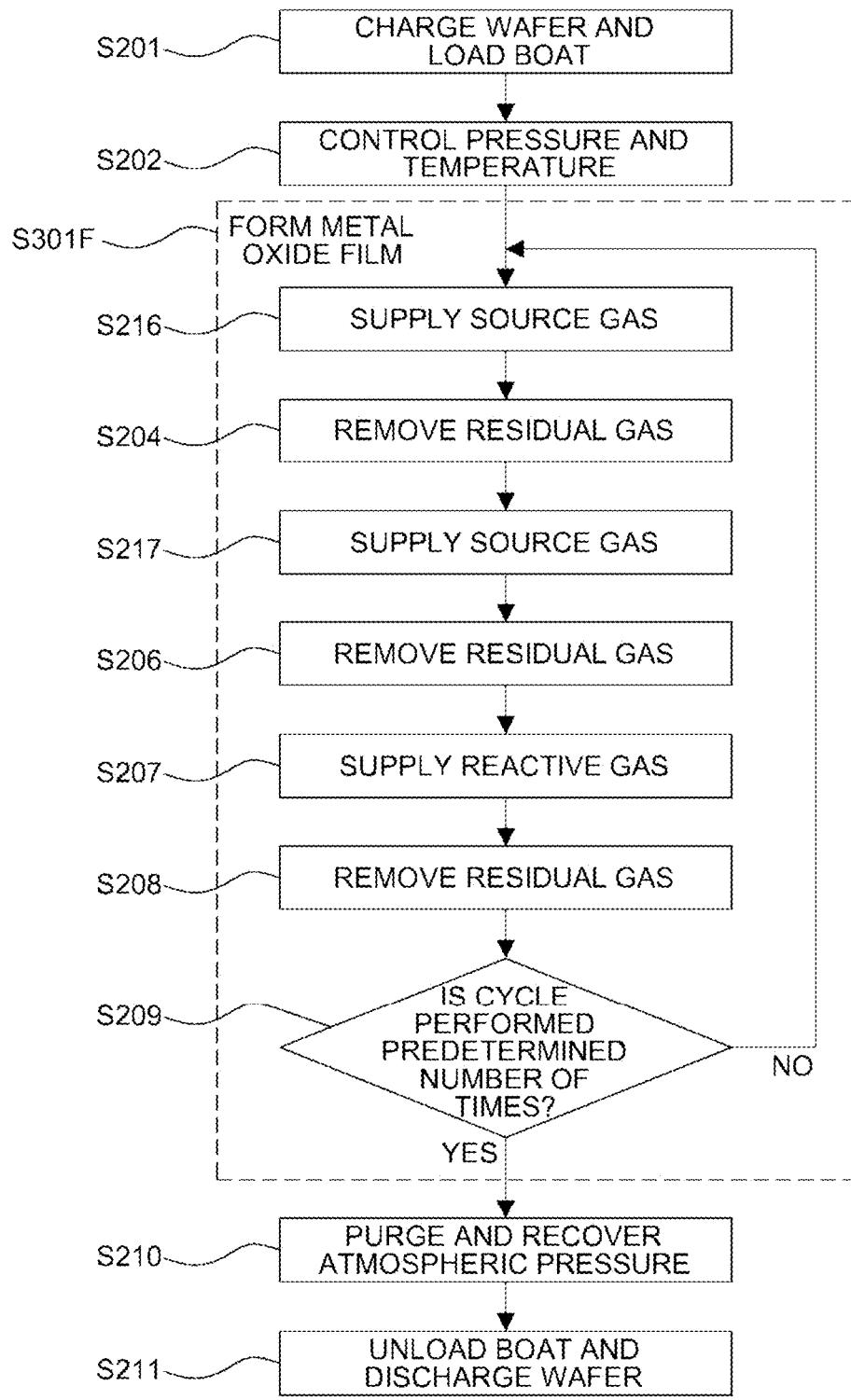
Figure 10I:
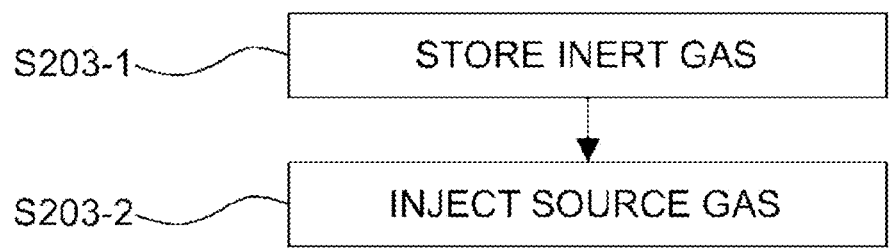

A substrate processing apparatus 10 and formation of a metal oxide film (S301F) according to a sixth embodiment of the present invention will be described below. As illustrated in FIGS. 7 and 8, the substrate processing apparatus 10 according to the sixth embodiment is different from the substrate processing apparatus 10 according to the first embodiment in that a gas supply pipe 320 configured to supply a source gas and a nozzle 420 configured to supply the source gas into a process chamber 201 are not installed. FIG. 10H is a flowchart of a method of manufacturing a semiconductor device according to the sixth embodiment of the present invention. Parts of the method of manufacturing a semiconductor device according to the sixth embodiment that are the same as those of the method of manufacturing a semiconductor device according to the first embodiment are not described again here.

In the substrate processing apparatus 10 according to the sixth embodiment of the present invention, the source gas is supplied upward via a gas supply hole 410*a* of a nozzle 410. By controlling a flow rate of the source gas supplied via the gas supply hole 410*a*, the source gas is supplied onto wafers 200 accommodated on the bottom and top of a boat 217.

For example, the source gas may be supplied to a first region of the process chamber 201 by supplying the source gas at a sixth TMA gas flow rate (a sixth source gas flow rate) when a mixture gas of the source gas and an inert gas is supplied upward via the gas supply hole 410*a*. The source gas may be supplied to a second region of the process chamber 201 by supplying the source gas at a seventh TMA gas flow rate (a seventh source gas flow rate) which is different from the sixth source gas flow rate when the mixture gas of the source gas and the inert gas is supplied upward via the gas supply hole 410*a*. The first and second regions of the process chamber 201 respectively refer to a lower region and an upper region (target regions) of the boat 217 in the process chamber 201. For example, when a flow rate of the mixture gas is adjusted to the sixth TMA gas flow rate in order to supply the source gas mainly to a lower region of the process chamber 201, the seventh TMA gas flow rate is adjusted to be higher than the sixth TMA gas flow rate so that the source gas may be supplied mainly to a middle region or an upper region of the process chamber 201.

The flow rate of the source gas supplied upward via the gas supply hole 410*a* may be controlled by an MFC 312. A flow rate of an inert gas, such as $N_2$ gas, supplied into a gas supply pipe 310 via a gas supply pipe 510 may be controlled by an MFC 512. A case in which the source gas is supplied to a desired region by changing the flow rate of the mixture gas of the source gas and the inert gas by controlling the flow rate of the inert gas will be described below. A process of controlling a flow rate of the inert gas supplied upward via the gas supply hole 410*a* may be divided into a plurality of sub-processes, e.g., two or more sub-processes. For example, the flow rate of the inert gas may be controlled in stages according to a region of the process chamber 201 to which the source gas is supplied. That is, a region of the process chamber 201 to which the source gas is to be supplied may be changed in stages by adjusting the flow rate of the inert gas in stages. That is, the flow rate of the inert gas supplied into the gas supply pipe 310 via the gas supply pipe 510 may be controlled such that the flow rate of the inert gas is controlled in stages. Thus, a desired amount of the source gas may be supplied onto random wafers 200 accommodated on a desired position on the boat 217 (the bottom or top of the boat 217).

When the flow rate of the inert gas is controlled in stages, the flow rate of the inert gas may be adjusted according to, for example, three levels such as a first flow rate, a second flow rate and a third flow rate (here, the first flow rate>the second flow rate>the third flow rate). When the flow rate of the inert gas is adjusted to the first flow rate, the source gas is supplied near an upper region of the process chamber 201. When the flow rate of the inert gas is adjusted to the second flow rate, the source gas is supplied near a middle region of the process chamber 201. When the flow rate of the inert gas is adjusted to the third flow rate, the source gas is supplied near the lower region of the process chamber 201. Thus, the source gas may be supplied onto the wafers 200 accommodated on the bottom, middle and top of the boat 217 by controlling the flow rate of the inert gas according to three levels, e.g., the first flow rate, the second flow rate and the third flow rate. Alternatively, the flow rate of the inert gas may be adjusted to four or more levels, e.g., to five levels.

A plurality of gas supply pipes (inert gas supply pipes) configured to supply the inert gas to the gas supply pipe 310 may be installed. A gas supply pipe which will supply the inert gas into the gas supply pipe 310 may be switched according to a flow rate of the inert gas supplied upward via the gas supply hole 410a. Thus, when the source gas and the inert gas are supplied into the process chamber 201 by adjusting the flow rate of the inert gas according to two levels, two inert gas supply pipes configured to supply the inert gas at different flow rates may be installed. For example, when the flow rate of the inert gas is adjusted according to two levels, e.g., a first flow rate and a second flow rate (here, the first flow rate>the second flow rate), the source gas may be supplied upward at a first source gas flow rate via the gas supply hole 410a while supplying the inert gas to the gas supply pipe 310 via the inert gas supply pipe configured to supply the inert gas at the first flow rate. Furthermore, the source gas may be supplied upward at a second source gas flow rate via a gas supply hole 420a while supplying the inert gas into the gas supply pipe 310 via the inert gas supply pipe configured to supply the inert gas at the second flow rate. Thus, the source gas supplied into the process chamber 201 at the first source gas flow rate is supplied near the middle region and the upper region of the process chamber 201. The source gas supplied into the process chamber 201 together with the inert gas at the second flow rate is supplied near the lower and middle regions of the process chamber 201. When the flow rate of the inert gas is adjusted according to three levels and the source gas and the inert gas are supplied into the process chamber 201, three inert gas supply pipes configured to supply the inert gas at different flow rates may be installed.

A tank for storing an inert gas (an inert gas storing unit) (not shown) may be further installed at the gas supply pipe 510. When TMA gas is supplied into the gas supply pipe 310, the TMA gas may be injected to the upper region of the process chamber 201 by supplying the inert gas stored in the tank into the gas supply pipe 510.

[Formation of Metal Oxide Film (S301F)]

Next, formation of a metal oxide film (S301F), in which supplying a source gas (S216) in which an inert gas is supplied upward at the first flow rate via the gas supply hole 410a of the nozzle 410 together with the source gas, removing a residual gas (S204), supplying the source gas (S217) in which the inert gas is supplied upward at the second flow rate different from the first flow rate via the gas supply hole 410a of the nozzle 410 together with the source gas, removing a residual gas (S206), supplying a reactive gas (S207) in which the reactive gas is supplied onto the wafers 200 via a plurality of gas supply holes 430a of a nozzle 430, and removing a residual gas (S208) are sequentially performed a predetermined number of times will be described below. Parts of the formation of the metal oxide film (S301F) that are the same as those of the formation of the metal oxide film (S301A) described above are not described again here.

In the supplying of the source gas (S216), TMA gas (the source gas) is supplied via the gas supply hole 410a of the nozzle 410 according to third process conditions. In the supplying of the source gas (S217), the TMA gas (the source gas) may be supplied via the gas supply hole 410a of the nozzle 410 according to fourth process conditions which are different from the third process conditions. The third and fourth process conditions may include flow rates of the inert gas supplied via the gas supply hole 410a of the nozzle 410, time durations of supplying the inert gas, flow rates of the TMA gas, time durations of supplying the TMA gas, etc.

The third and fourth process conditions may include flow rates of $N_2$ gas (inert gas). A sixth inert gas flow rate (a sixth inert gas flow rate) according to the third process conditions is preferably higher than a seventh inert gas flow rate (a seventh inert gas flow rate) according to the fourth process conditions. The TMA gas may be supplied to the upper region of the process chamber 201 by supplying the inert gas via the gas supply hole 410a of the nozzle 410 at the sixth inert gas flow rate which is higher than the seventh inert gas flow rate. For example, a flow rate of a mixture gas of the TMA gas and the inert gas may be adjusted by adjusting the flow rate of the inert gas to the sixth inert gas flow rate according to the third process conditions. The flow rate of the mixture gas of the TMA gas and the inert gas may be adjusted to be lower than when the flow rate of the inert gas is the sixth inert gas flow rate by adjusting the flow rate of the inert gas to the seventh inert gas flow rate (which is lower than the sixth inert gas flow rate) according to the fourth process conditions.

The third and fourth process conditions may include flow rates of the TMA gas (source gas). A sixth TMA gas flow rate (a sixth source gas flow rate) according to the third process conditions is preferably higher than a seventh TMA gas flow rate (a seventh source gas flow rate) according to the fourth process conditions. The TMA gas may be supplied to the upper region of the process chamber 201 by supplying the TMA gas via the gas supply hole 410a of the nozzle 410 at the sixth source gas flow rate which is higher than the seventh source gas flow rate.

In the supplying of the source gas (S216) and the supplying of the source gas (S217), the flow rate of the TMA gas supplied into the process chamber 201 via the gas supply hole 410a of the nozzle 410 is controlled by the MFC 312 to range, for example, from 10 sccm to 500 sccm, preferably range from 50 sccm to 300 sccm, and more preferably range from 50 sccm to 150 sccm. When the flow rate of the TMA gas supplied into the process chamber 201 via the gas supply hole 410a of the nozzle 410 is 500 sccm or less, removing a residual gas to be described below may be preferably performed. When the flow rate of the TMA gas supplied into the process chamber 201 via the gas supply hole 410a of the nozzle 410 is 10 sccm or more, a reaction rate of the TMA gas at surfaces of the wafers 200 may be improved.

When the TMA gas is supplied into the process chamber 201 via the gas supply hole 410a of the nozzle 410, a flow rate of $N_2$ gas supplied into the process chamber 201 via the gas supply hole 410a of the nozzle 410 is controlled by the MFC 512. In the supplying of the source gas (S216), the first flow rate ranges, for example, from 10 slm to 30 slm, preferably ranges from 10 slm to 20 slm, and more preferably ranges from 15 slm to 20 slm. When the first flow rate is 30 slm or less, the reaction rate of the TMA gas may be improved. When the first flow rate is 10 slm or more, the TMA gas may be supplied to a higher region of the process chamber 201 and removing a residual gas to be described above may be preferably performed.

In the supplying of the source gas (S217), the second flow rate which is different from the first flow rate is controlled by the MFC 512 to range, for example, from 1 slm to 30 slm, preferably range from 1 slm to 20 slm, and more preferably range from 1 slm to 10 slm. When the second flow rate is 30 slm or less, the reaction speed of the TMA gas may be improved. When the second flow rate is 1 slm or more, removing a residual gas to be described below may be preferably performed.

In the formation of the metal oxide film (S301F), the source gas may be uniformly and sufficiently supplied to a plurality of desired regions even via one nozzle by controlling an inert gas flow rate which is one of process conditions, thereby improving the uniformity of a film.

[Examples]

Although examples of the present invention will be described in greater detail below, the present invention is not limited to these examples.

In order to determine an effect on formation of an aluminum oxide ($Al_2O_3$) film in thickness and uniformity by supplying a source gas via two supply nozzles, a case in which an aluminum oxide ($Al_2O_3$) film was formed by supplying the source gas onto wafers via two supply nozzles (first example, sequences corresponding to the second modified example of the first embodiment) and a case in which an aluminum oxide ($Al_2O_3$) film was formed by supplying the source gas onto wafers via one supply nozzle (second example) are described below as examples. The substrate processing apparatus 10 of FIG. 4 was used in the first example, and the substrate processing apparatus 10 of FIG. 7 was used in the second example. Furthermore, in the second example, an amount of an inert gas to be supplied into a process chamber was controlled in two stages.

[Experimental Conditions]

In the first example and the second example, by using the respective substrate processing apparatuses 10 of FIGS. 4 and 7, trimethylaluminum (TMA) and ozone ($O_3$) were reacted with each other to form aluminum oxide films on 300 mm wafers which are silicon (Si) substrates for measuring film thickness.

In the first example, the TMA gas and the $O_3$ gas were supplied into the process chamber to form an aluminum oxide film on the 300 mm wafers under the following conditions:

Flow rate of TMA gas supplied via first nozzle (first time): 50 to 60 sccm ($N_2$ gas flow rate: 2 to 4 slm)

Flow rate of TMA gas supplied via first nozzle (second time): 50 to 60 sccm ($N_2$ gas flow rate: 15 to 20 slm)

Flow rate of TMA gas supplied via second nozzle: 50 to 60 sccm ($N_2$ gas flow rate: 5 to 8 slm)

Internal pressure of process chamber: 100 to 200 Pa

Source gas supply duration: 4 to 6 seconds (first nozzle, first time), 4 to 6 seconds (first nozzle, second time), 1 to 3 seconds (second nozzle)

Internal temperature of process chamber: 550° C.

Flow rate of $O_3$ gas supplied via third nozzle: 10 to 15 slm $O_3$ gas supply duration: 10 to 20 seconds In the second example, an aluminum oxide film was formed on the 300 mm wafers by supplying TMA gas and $O_3$ gas into the process chamber under the following conditions:

Flow rate of TMA gas supplied via nozzle (first time): 50 to 60 sccm ($N_2$ gas flow rate: 2 to 4 slm)

Flow rate of TMA gas supplied via nozzle (second time): 50 to 60 sccm ($N_2$ gas flow rate: 15 to 20 slm)

Internal pressure of process chamber: 100 to 200 Pa

Source gas supply duration: 4 to 6 seconds (first time), 4 to 6 seconds (second time)

Internal temperature of process chamber: 550° C.

Flow rate of $O_3$ gas supplied via nozzle: 10 to 15 slm $O_3$ gas supply duration: 10 to 20 seconds Thicknesses of the formed aluminum oxide films were measured. The thickness of the aluminum oxide film formed on a wafer accommodated on the bottom of a boat among the wafers was measured. The uniformity of the aluminum oxide film was calculated from a maximum film thickness and a minimum film thickness measured at 49 points on all the 300 mm wafers. The uniformity of the aluminum oxide film was calculated by Equation below.

Uniformity of film thickness=[(maximum film thickness−minimum film thickness)/2]/[average film thickness]×100　　　[Equation]

[Experimental Result]

Figure 9:
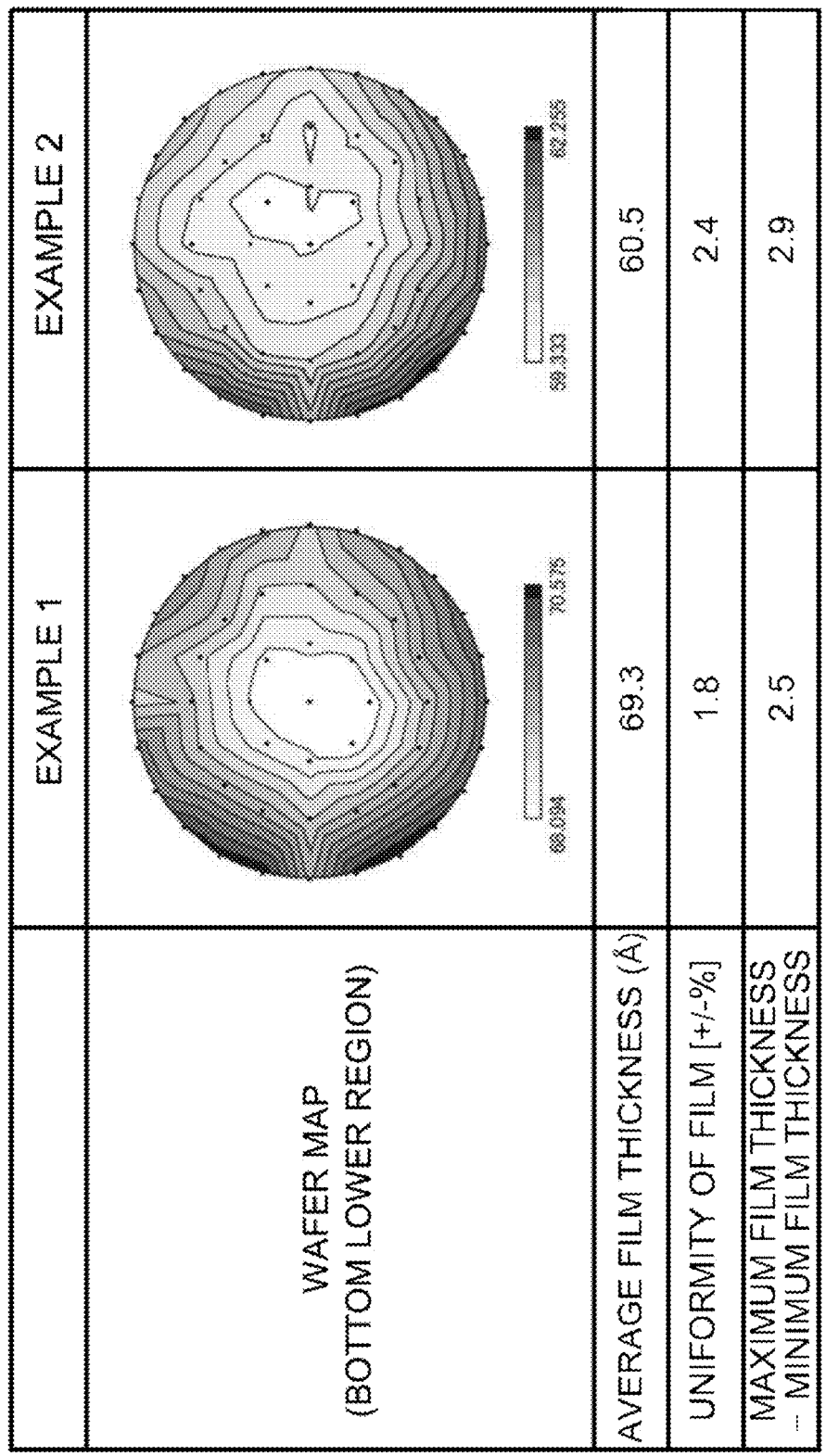
FIG. 9 is a diagram illustrating thickness uniformity of films formed on wafers according to a first example and a second example.

A result of determining the uniformity of the aluminum oxide films formed on the wafers according to the first example and the second example is illustrated in FIG. 9. As illustrated in FIG. 9, the uniformity of the aluminum oxide film formed on the wafer on the bottom of the boat was 1.8(+/−%) in the first example in which the source gas was supplied via two nozzles, and was 2.4(+/−%) in the second example in which the source gas was supplied via one nozzle. When the source gas is supplied via two nozzles as in the first example, the uniformity of a film formed on the wafer accommodated in a lower region of the process chamber (the wafer on the bottom of the boat) may be improved. Although the source gas was supplied onto the wafer accommodated in the lower region of the process chamber for the same time in the first example and the second example, the thickness of the aluminum oxide film was 69.3 Å in the first example and was 60.5 Å in the second example. Thus, the thickness of the aluminum oxide film formed in the first example was higher by 14.5% than that of the aluminum oxide film formed in the second example. Accordingly, the thickness of a film formed on a desired region (the wafer on the bottom of the boat) may be increased with consumption of the same amount of the source gas.

Other Embodiments of the Present Invention

The embodiments described above may be used in appropriate combination. Furthermore, the present invention is not limited to the above-described embodiments and may be embodied in many different forms without departing from the scope of the invention.

Cases in which the present invention is applied to formation of an oxide film containing Al which is a metal element have been described in the above-described embodiments. The present invention is, however, not limited to the above-described embodiments and is applicable to formation of an oxide film, a nitride film, a carbide film, a boride film, or a composition film thereof containing an element other than aluminum (Al), such as titanium (Ti), tantalum (Ta), tungsten (W), cobalt (Co), yttrium (Y), ruthenium (Ru), hafnium (Hf), zirconium (Zr), molybdenum (Mo), and silicon (Si).

When a film containing the above-described elements is formed, a titanium (Ti)-containing gas, a tantalum (Ta)-containing gas, a tungsten (W)-containing gas, a cobalt (Co)-containing gas, an yttrium (Y)-containing gas, a ruthenium (Ru)-containing gas, a hafnium (Hf)-containing gas, a zirconium (Zr)-containing gas, a molybdenum (Mo)-containing gas, or a silicon (Si)-containing gas other than an aluminum (Al)-containing gas may be used as a source gas.

In detail, a gas such as aluminum trichloride ($AlCl_3$), aluminum trifluoride ($AlF_3$), titanium tetrachloride ($TiCl_4$), titanium tetrafluoride ($TiF_4$), tetrakis(dimethylamino)titanium ($Ti[N(CH_3)_2]_4$, abbreviated as TDMAT), tantalum pentachloride ($TaCl_5$), tantalum pentafluoride ($TaF_5$), pentaethoxytantalum ($Ta(OC_2H_5)_5$, abbreviated as PET), tungsten hexachloride ($WCl_6$), tungsten hexafluoride ($WF_6$), bis(tertiarybutylimino)bis(tertiarybutylamino)tungsten (($C_4H_9NH)_2W(C_4H_9N)_2$), tungsten hexacarbonyl ($W(CO)_6$), cobalt dichloride ($CoCl_2$), cobalt difluoride ($CoF_2$), bis(ethyl cyclopentadienyl)cobalt ($C_{14}H_{18}Co$), cobalt hexacarbonyl ($CoCO)_6$, yttrium trichloride ($YCl_3$), yttrium trifluoride ($YF_3$), tris(butylcyclopentadienyl)yttrium ($Y(C_5H_4CH_2(CH_2)_2CH_3)_3$), ruthenium trichloride ($RuCl_3$), ruthenium trifluoride ($RuF_3$), bis(ethyl cyclopentadienyl)ruthenium ($C_{14}H_{18}Ru$), hafnium tetrachloride ($HfCl_4$), hafnium tetrafluoride ($HfF_4$), tetrakis(ethylmethylamino)hafnium ($Hf[N(CH_3)CH_2CH_3]_4$, abbreviated as TEMAH), tetrakis(dimethylamino)hafnium ($Hf[N(CH_3)_2]_4$, abbreviated as TDMAH), tetrakis(diethylamino)hafnium ($Hf[N(C_2H_5)_2]_4$, abbreviated as TDEAH), zirconium tetrachloride ($ZrCl_4$), zirconium tetrafluoride ($ZrF_4$), tetrakis(ethylmethylamino)zirconium ($Zr[N(CH_3)CH_2CH_3]_4$, abbreviated as TEMAZ), tetrakis(dimethylamino)zirconium ($Zr[N(CH_3)_2]_4$, abbreviated as TDMAZ), tetrakis(diethylamino)zirconium ($Zr[N(C_2H_5)_2]_4$, abbreviated as TDEAZ), tris(dimethylamino)cyclopentadienylzirconium (($C_5H_5)Zr[N(CH_3)_2]_3$), tetrachlorosilane (i.e., silicon tetrachloride) ($SiCl_4$, abbreviated as STC), dichlorosilane ($SiH_2Cl_2$, abbreviated as DCS), monochlorosilane ($SiH_3Cl$, abbreviated as MCS), hexachlorodisilane ($Si_2Cl_6$, abbreviated as HCDS), tetrakis(dimethylamino)silane ($Si[N(CH_3)_2]_4$, abbreviated as 4DMAS), tris(dimethylamino)silane ($Si[N(CH_3)_2]_3H$, abbreviated as 3DMAS), bis(tertiarydiethylamino)silane ($Si[N(C_2H_5)_2]_2H_2$, abbreviated as BDEAS), and bis(tertiary-butylimino)silane ($SiH_2[NH(C_4H_9)]_2$, abbreviated as BTBAS) may be used as the source gas, as well as TMA.

When a film containing the above-described elements is formed, a gas such as water ($H_2O$), oxygen ($O_2$), hydrogen peroxide ($H_2O_2$), nitrous oxide ($N_2O$), and a mixture gas of $O_2$ and hydrogen ($H_2$) may be used as a reactive gas, as well as $O_3$. Furthermore, $H_2$ and $O_2$ may be separately supplied, $H_2$ and $O_2$ may be plasma-excited, $H_2$ and $O_2$ may be activated to be used as a hydrogen radical, an oxygen radical, atomic hydrogen and atomic oxygen, or $H_2O$ may be generated in the process chamber 201, as well as supplying $H_2O$ in the form of vapor.

In addition to the oxygen-containing gas, a nitrogen (N)-containing gas, a carbon (C)-containing gas, etc. may be used as the reactive gas. Alternatively, a gas containing an N—H bond, such as ammonia ($NH_3$), nitrogen ($N_2$), nitrous oxide ($N_2O$), diazene ($N_2H_2$) gas, hydrazine ($N_2H_4$) gas, and $N_3H_8$ gas, may be used as the reactive gas. Furthermore, in addition to the above-described gases, an organic hydrazine-based gas, e.g., a methyl hydrazine-based gas such as monomethyl hydrazine (($CH_3)HN_2H_2$, abbreviated as MMH) gas, dimethyl hydrazine (($CH_3)_2N_2H_2$, abbreviated as DMH) gas, trimethyl hydrazine (($CH_3)_2N_2(CH_3)H$, abbreviated as TMH) gas, etc., or an ethyl hydrazine-based gas such as ethyl hydrazine (($C_2H_5)HN_2H_2$, abbreviated as EH) gas may be used as the gas containing an N—H bond. Otherwise, propylene ($C_3H_6$) may be used as the gas containing an N—H bond. Otherwise, an ethylamine-based gas such as trimethylamine (($C_2H_5)_3N$, abbreviated as TEA) gas, diethylamine (($C_2H_5)_2NH$, abbreviated as DEA) gas, monoethylamine ($C_2H_5NH_2$, abbreviated as MEA) gas, etc.; a methylamine-based gas such as tri-methylamine (($CH_3)_3N$, abbreviated as TMA) gas, dimethylamine (($CH_3)_2NH$, abbreviated as DMA) gas, monomethylamine ($CH_3NH_2$, abbreviated as MMA) gas, etc.; a propylamine-based gas such as tripropylamine (($C_3H_7)_3N$, abbreviated as TPA) gas, dipropylamine (($C_3H_7)_2NH$, abbreviated as DPA) gas, monopropylamine ($C_3H_7NH_2$, abbreviated as MPA) gas, etc.; an isopropylamine-based gas such as tri-isopropylamine ($[(CH_3)_2CH]_3N$, abbreviated as TIPA) gas, di-isopropylamine ($[(CH_{32}CH]_2NH$, abbreviated as DIPA) gas, mono-isopropylamine (($CH_3)_2CHNH_2$, abbreviated as MIPA) gas, etc.; a butylamine-based gas such as tributylamine (($C_4H_9)_3N$, abbreviated as TBA) gas, dibutylamine (($C_4H_9)_2NH$, abbreviated as DBA) gas, monobutylamine ($C_4H_9NH_2$, abbreviated as MBA) gas, etc.; or an isobutylamine-based gas such as tri-isobutylamine ($[(CH_3)_2CHCH_2]_3N$, abbreviated as TIBA) gas, di-isobutylamine ($[(CH_3)_2CHCH_2]_2NH$, abbreviated as DIBA) gas, monoisobutylamine (($CH_3)_2CHCH_2NH_2$, abbreviated as MIBA) gas, etc. may be used as the gas containing an N—H bond. That is, for example, at least one gas among amine-based gases of empirical formulae such as $(C_2H_5)xNH_3$-x, $(CH_3)xNH_3$-x, $(C_3H_7)xNH_3$-x, $[(CH_3)_2CH]xNH_3$-x, $(C_4H_9)xNH_3$-x, and $[(CH_3)_2CHCH_2]xNH_3$-x (here, x denotes an integer ranging from 1 to 3) may be used as the gas containing an N—H bond.

In addition to the AlO film, examples of a film containing the above-described elements may include an aluminum nitride film (AlN film), an aluminum carbide film (AlC film), an aluminum carbonitride film (AlCN film), a titanium oxide film (TiO film), a titanium nitride film (TiN film), a titanium oxynitride film (TiON film), a titanium carbide film (TiC film), a titanium carbonitride film (TiCN film), a tantalum oxide film (TaO film), a tantalum nitride film (TaN film), a tantalum oxynitride film (TaON film), a tantalum carbide film (TaC film), a tantalum carbonitride film (TaCN film), a tungsten oxide film (WO film), a tungsten nitride film (WN film), a tungsten oxynitride film (WON film), a tungsten carbide film (WC film), a tungsten carbonitride film (WCN film), a cobalt oxide film (CoO film), a cobalt nitride film (CoN film), a cobalt oxynitride film (CoON film), a cobalt carbide film (CoC film), a cobalt carbonitride film (CoCN film), an yttrium oxide film (YO film), an yttrium nitride film (YN film), an yttrium oxynitride film (YON film), an yttrium carbide film (YC film), an yttrium carbonitride film (YCN film), a ruthenium oxide film (RuO film), a ruthenium nitride film (RuN film), a ruthenium oxynitride film (RuON film), a ruthenium carbide film (RuC film), a ruthenium carbonitride film (RuCN film), a hafnium oxide film (HfO film), a hafnium nitride film (HfN film), a hafnium oxynitride film (HfON film), a hafnium carbide film (HfC film), a hafnium carbonitride film (HfCN film), a zirconium oxide film (ZrO film), a zirconium nitride film (ZrN film), a zirconium oxynitride film (ZrON film), a zirconium carbide film (ZrC film), a zirconium carbonitride film (ZrCN film), a molybdenum oxide film (MoO film), a molybdenum nitride film (MoN film), a molybdenum oxynitride film (MoON film), a molybdenum carbide film (MoC film), a molybdenum carbonitride film (MoCN film), a silicon oxide film (SiO film), a silicon nitride film (SiN film), a silicon oxynitride film (SiON film), a silicon carbide film (SiC film), a silicon carbonitride film (SiCN film), or a composite film thereof.

Although cases in which an inert gas includes $N_2$ gas have been described in the above-described embodiments, the present invention is not limited thereto and a rare gas such as Ar gas, He gas, Ne gas and Xe gas may be used as the inert gas.

As described above, the present invention is also applicable to formation a film other than an AlO film. In particular, the present invention is effective when a film is formed using a source gas of low pyrolysis temperature. In particular, the present invention is effectively applied to an arch-shaped film formed on a substrate.

Although various exemplary embodiments and examples of the present invention have been described above, the present invention is not limited the above embodiments and examples. The above embodiments, the above modified examples, and the like may be used in appropriate combination.

According to the present invention, a technique of efficiently forming a film by sufficiently supplying a source gas to a substrate accommodated in a process chamber and enhancing the uniformity of the film formed on the substrate accommodated in the process chamber can be provided.

What is claimed is:

1. A method of a semiconductor device manufacturing, comprising:
    (a) supplying a source gas to an upper region of a process chamber where vertically stacked substrates are accommodated through a first gas supply hole disposed at a front end of a first nozzle disposed in a lower region of the process chamber where the source gas is not pyrolyzed, wherein the first nozzle is installed along a stacking direction of the vertically stacked substrates;
    (b) supplying the source gas to substrates disposed in the lower region and a middle region of the process chamber through a plurality of second gas supply holes of a second nozzle extending from the lower region to the middle region along the stacking direction, wherein the plurality of second gas supply holes are disposed at positions facing the substrates disposed in the lower region and the middle region; and
    (c) supplying a reactive gas to substrates disposed in the lower region, the middle region and the upper region of the process chamber through a plurality of third gas supply holes of a third nozzle extending from the lower region to the upper region along the stacking direction, wherein the plurality of third gas supply holes are disposed at positions facing the substrates of the vertically stacked substrates disposed in the lower region, the middle region and the upper region.

2. The method of claim 1, further comprising: (d) exhausting the process chamber.

3. The method of claim 2, wherein gas remaining in the process chamber is exhausted in a direction parallel to a main surface of the vertically stacked substrates in the step (d).

4. The method of claim 2, wherein the steps (a), (d), (b), (d), (c) and (d) are repeated in order without mixing the source gas and the reactive gas.

5. The method of claim 2, wherein the steps (a), (d), (b), (d), (c) and (d) are repeated in order without mixing the source gas and the reactive gas.

6. The method of claim 2, wherein the steps (b), (d), (a), (d), (c) and (d) are repeated in order without mixing the source gas and the reactive gas.

7. The method of claim 2, wherein the steps (b), (a), (d), (c) and (d) are repeated in order without mixing the source gas and the reactive gas.

8. The method of claim 2, wherein the steps (a), (d), (c), (d), (b), (d), (c) and (d) are repeated in order without mixing the source gas and the reactive gas.

9. The method of claim 2, wherein the steps (b), (d), (c), (d), (a), (d), (c) and (d) are repeated in order without mixing the source gas and the reactive gas.

10. The method of claim 1, further comprising:
    (e) supplying into the process chamber an inert gas at a first flow rate along with the source gas supplied in the step (a); and
    (f) supplying into the process chamber through the first gas supply hole the inert gas at a second flow rate different from the first flow rate along with the source gas between the steps (a) and (b) such that the source gas is supplied to the lower region and the middle region.

11. The method of claim 2, further comprising: (g) simultaneously performing the steps (a) and (b), and wherein the steps (g), (d), (c) and (d) are repeated in order.

12. The method of claim 1, wherein the step (a) comprises: storing an inert gas in an inert gas storing unit; and injecting the source gas into the process chamber by the inert gas stored in the inert gas storing unit.

13. A method of manufacturing a semiconductor device, comprising:
    (a) supplying a source gas to a lower region and a middle region of a process chamber where vertically stacked substrates are accommodated through a first gas supply hole disposed at a front end of a first nozzle disposed in the lower region of the process chamber where the source gas is not pyrolyzed, wherein the first nozzle extends along a stacking direction of the vertically stacked substrates;
    (b) supplying the source gas to the middle region and an upper region of the process chamber through a second gas supply hole disposed at a front end of a second nozzle extending along the stacking direction, wherein the second gas supply hole is disposed higher than the first gas supply hole; and
    (c) supplying a reactive gas into the process chamber through a plurality of third gas supply holes of a third nozzle extending from the lower region to the upper region along the stacking direction, wherein the plurality of third gas supply holes are disposed at positions facing substrates disposed in the lower region, the middle region and the upper region.

14. A method of manufacturing a semiconductor device, comprising:
    (a) simultaneously supplying a source gas and an inert gas at a first flow rate to a middle region and an upper region of a process chamber where vertically stacked substrates are accommodated through a first gas supply hole disposed at a front end of a first nozzle disposed in a lower region of the process chamber where the source gas is not pyrolyzed, wherein the first nozzle extends along a stacking direction of the vertically stacked substrates;
    (b) simultaneously supplying the source gas and the inert gas at a second flow rate smaller than the first flow rate to the lower region and the middle region through the first gas supply hole; and
    (c) supplying a reactive gas into the process chamber through a plurality of second gas supply holes of a third nozzle extending from the lower region to the upper region along the stacking direction, wherein the plurality of third gas supply holes are disposed at positions facing substrates disposed in the lower region, the middle region and the upper region.

* * * * *